(12) United States Patent
Takei et al.

(10) Patent No.: US 7,431,584 B2
(45) Date of Patent: Oct. 7, 2008

(54) HEAT PROCESSING APPARATUS AND HEAT PROCESSING METHOD

(75) Inventors: Toshichika Takei, Kikuchi-gun (JP); Masatoshi Kaneda, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 115 days.

(21) Appl. No.: 10/774,419

(22) Filed: Feb. 10, 2004

(65) Prior Publication Data
US 2004/0157419 A1    Aug. 12, 2004

(30) Foreign Application Priority Data
Feb. 10, 2003    (JP)    ............... 2003-032603

(51) Int. Cl.
B05C 11/02    (2006.01)
B05C 13/00    (2006.01)
B05C 13/02    (2006.01)
B05C 11/00    (2006.01)
F27D 3/00    (2006.01)

(52) U.S. Cl. ............... 432/11; 432/241; 118/696; 118/52

(58) Field of Classification Search ............... 438/553; 432/11, 241, 253; 118/696, 52, 58
See application file for complete search history.

(56) References Cited

U.S. PATENT DOCUMENTS

| | | | | |
|---|---|---|---|---|
| 4,874,564 A | * | 10/1989 | Sudani et al. | ............... 264/29.7 |
| 5,158,828 A | * | 10/1992 | Sudani et al. | ............... 428/368 |
| 6,113,724 A | * | 9/2000 | Ogawa | ............... 156/212 |
| 6,274,465 B1 | * | 8/2001 | Ballantine et al. | ............... 438/510 |
| 6,743,395 B2 | * | 6/2004 | Fukunaga et al. | ............... 419/23 |
| 6,881,058 B2 | * | 4/2005 | Kawano et al. | ............... 432/152 |
| 2005/0089597 A1 | * | 4/2005 | Ito | ............... 425/388 |

FOREIGN PATENT DOCUMENTS

| | | | |
|---|---|---|---|
| JP | 11-204428 | | 7/1999 |
| JP | 2002-100562 | | 4/2002 |
| JP | 2002-100562 | * | 5/2002 |

* cited by examiner

*Primary Examiner*—Chuong A. Luu
(74) *Attorney, Agent, or Firm*—Oblon, Spivak, McClelland, Maier & Neustadt, P.C.

(57) ABSTRACT

A heat processing apparatus for heating a mask substrate is disclosed. A mask substrate on which a coating solution has been coated is placed on a heating plate that heats the substrate. A frame member is disposed on the heating plate so that the frame member faces a side surface of the mask substrate placed on the heating plate when the frame member is attached to the heating plate and that a clearance is formed between the frame member and the heating plate when the frame member is attached to the heating plate. The frame member suppresses heat radiated from the side surface of the substrate. As a result, the temperature uniformity of the surface of the substrate can be improved. In addition, since the clearance is formed between the frame member and the heating plate, particles do not accumulate in the region. Thus, adhesion of particles to the substrate can be suppressed.

14 Claims, 19 Drawing Sheets

FIRST EXAMPLE
(HEATING PLATE FOR
12-INCH SIZE WAFER,
WITH FRAME MEMBER)

▓ 120.6 ~ 121°C

▨ 120.2 ~ 120.6°C

▨ 119.8 ~ 120.2°C

▨ 119.4 ~ 119.8°C

☐ 119.0 ~ 119.4°C

FIRST COMPARISON
(HEATING PLATE FOR
12-INCH SIZE WAFER,
WITHOUT FRAME MEMBER)

SECOND COMPARISON
(HEATING PLATE FOR
8-INCH SIZE WAFER,
WITHOUT FRAME MEMBER)

PRIOR ART

HEAT PROCESSING APPARATUS AND HEAT PROCESSING METHOD

BACKGROUND OF THE INVENTION

1. Field of the Invention

The present invention relates to a heat processing apparatus and a heat processing method for performing a heat process for a substrate such as a mask substrate on which for example a resist solution has been coated.

2. Description of the Related Art

When a semiconductor mask is formed in a fabrication process for a semiconductor device, a resist solution is coated on a square mask substrate. With a photo mask, the resist film is exposed and developed. As a result, a desired resist pattern is formed. As such a substrate, for example a six-inch size square glass substrate having four sides each of which is 152 mm long and having a thickness of 6.35 mm is used.

The resist solution is made by dissolving a component of a coating film in a solvent. After the resist solution is coated on a substrate, a heating process for heating the substrate at a predetermined temperature and evaporating the solvent is preformed. The heating process is performed by placing a substrate on a heating plate that has a heater. However, when a substrate has a large thickness as described above, the temperature uniformity of the surface of the substrate tends to deteriorate. In other words, when a substrate has a large thickness, heat radiated from the side surfaces of the substrate is large, therefore, there is a tendency of which the temperature of the peripheral region of the substrate is lower than the temperature of the center region. Thus, when the substrate temperature varies on the surface of the substrate, the evaporation amount of the solvent varies on the surface. As a result, the uniformity of the surface of the resist film deteriorates.

Thus, as shown in FIG. 19, a concave portion 11 is formed in a heating plate 10. A substrate 12 is placed in the concave portion 11. In this state, the substrate 12 is heated by the heating plate 10. As a result, vicinity regions of the side surfaces of the substrate are heated by the heating plate 10. Thus, heat radiation from the side surfaces can be suppressed. In FIG. 19, reference numeral 13 represents a heater. However, in such a method, particles may accumulate at corner portions of the concave portion 11. It is difficult to remove these particles. In addition, there is a possibility particles adhering to the substrate 12. Moreover, to form the concave portion 11 in the heating plate 10, long time and great cost will be required. Thus, the fabrication cost of the substrate will rise.

To suppress heat radiation from the side surfaces of the substrate, the inventors of the present invention are devising a technique of which a side plate 14 is disposed around a substrate 12 placed on a heating plate 10 as shown in FIG. 20. As examples of such a technique, a structure of which an outer frame that is higher than an object to be processed and surrounds the object is disposed at a predetermined placement position of the object on a heating plate (refer to, for example, Japanese Patent Laid-open Publication No. 11-204428 published by Japan Patent Office), a structure of which a side plate that is equal to or higher than a mask and that surrounds it is disposed on a heating plate, and a structure of which a side heating plate disposed around a mask placed on a heating plate prevents heat radiation from side surfaces of the mask (refer to for example Japanese Patent Laid-open Publication No. 2002-100562 published by Japan Patent Office) have been proposed.

However, the publication No. 11-204428 discloses the outer frame so as to prevent air from entering the vicinity of a substrate. Thus, the outer frame is disposed on the heating place without a clearance. Likewise, the publication No. 2002-100562 discloses the structure of which the side plate and the side heating plate are disposed without a clearance as shown in FIG. 4 and FIG. 6 of the publication. Since the outer frame of the publication No. 11-204428 and the side plate of the publication No. 2002-100562 are disposed in such a manner that they are higher than the front surfaces of the object to be processed and the mask. Thus, as shown in FIG. 21, when particles 15 scatter by an air current in a processing vessel and contact the front surface of the substrate 12, the particles 15 may cause a defect of the substrate to be processed. When the particles 15 enter a clearance formed between the substrate and the side plate 14 or the like, the particles 15 do not scatter, but accumulate at corner portions between the side plate 14 or the like and the heating plate 10. As a result, there is a possibility of which the substrate 12 is contaminated by particles 15.

SUMMARY OF THE INVENTION

The present invention is made from the foregoing point of view. An object of the present invention is to provide a technology that secures high temperature uniformity of the surface of a substrate placed on a heating plate and heated thereby.

Another object of the present invention is to provide a technology for satisfying both suppression of contamination of a substrate with particles and improvement of temperature uniformity of the surface of a substrate.

The present invention is an apparatus, for heat-processing a mask substrate, comprising a heating plate for heating the mask substrate, heating means for heating the heating plate and a frame member being detachably disposed to the heating plate so that the frame member faces a side surface of the mask substrate placed on the heating plate when the frame member is attached to the heating plate.

In such a structure, when the mask substrate is heated by the heating plate, since the frame member is disposed opposite to the side surfaces of the mask substrate, heat radiation from the side surfaces of the mask substrate can be suppressed. Thus, the temperature uniformity of the surface of the mask substrate can be improved. In addition, the frame member is detachably disposed on the heating plate. Thus, particles that accumulate between for example the frame member and each of the side surfaces of the mask substrate can be removed by detaching the frame member from the heating plate. Consequently, maintenance of the apparatus can be easily performed. In addition, contamination of the heating plate with particles can be suppressed. In this example, the mask substrate means a substrate having an exposure light passing portion and an exposure light insulating portion that are used to form a wiring pattern on a semiconductor wafer or a glass substrate for a liquid crystal device.

According to an aspect of the present invention, a clearance is formed between the frame member and the heating plate when the frame member is attached to the heating plate. In such a structure, particles can be prevented from accumulating between the frame member and the heating plate. As a result, particles can be prevented from adhering to the mask substrate.

According to an aspect of the present invention of the present invention, the frame member has a surface opposite to the side surface of the mask substrate placed on the heating plate, and the surface is curved in a concave shape and a convex shape. In such a structure, the frame member is curved in such a manner that a near portion and a far portion to the mask substrate are formed in the frame member. Thus, an appropriate portion of the side surfaces of the mask substrate can be selectively heated by the frame member. As a result, a heat radiation from the side surfaces of the mask substrate can selectively be controlled, thus high temperature uniformity of the surface of the mask substrate can be secured.

According to an aspect of the present invention, the surface is a mirror surface. Thus, heat radiated from the side surfaces of the mask substrate is reflected by the mirror surface of the frame member. As a result, the temperatures of the side surfaces of the mask substrate can be prevented from decreasing.

According to an aspect of the present invention, the surface is a rough surface. In this example, the rough surface is a surface whose surface roughness is larger than the mirror surface. For example, the rough surface has a roughness of around Ra=100 μm. Thus, heat radiation from the rough surface of the frame member increases. The heat radiation causes the side surfaces of the mask substrate to be heated. In addition, the temperatures of the side surfaces of the mask substrate can be prevented from decreasing.

According to an aspect of the present invention, the heat processing apparatus further comprises a driving mechanism for moving the frame member so that a distance between the frame member and the side of the mask substrate placed on the heating plate varies. In addition, the heat processing apparatus further comprises means for detecting a temperature of the mask substrate and a controlling portion for controlling the driving mechanism in accordance with the detected temperature. In such a structure, by having the frame member to move away from the mask substrate and approach closer to it, heat radiation from the side surfaces of the mask substrate is controlled. As a result, the temperature uniformity of the surface of the mask substrate can be improved.

According to an aspect of the present invention, the controlling portion determines whether the temperature of the mask substrate is in a rising state or in a constant state in accordance with the detected temperature, controls the driving mechanism so that the distance between the frame member and the side surface of the mask substrate placed on the heating plate becomes a first distance when the temperature of the mask substrate is in the rising state and a second distance smaller than the first distance when the temperature of the mask substrate is in the constant state.

According to an aspect of the present invention, the frame member is divided in a peripheral direction of the mask substrate placed on the heating plate. Thus, by independently controlling the positions of the divided frame members, the temperature of each portion of the mask substrate can be adjusted. As a result, the temperature uniformity of the surface of the substrate can further be improved.

According to an aspect of the present invention, the frame member has a heating mechanism for heating the frame member. Thus, since the frame member itself can be heated, the side surfaces of the mask substrate can be more securely and easily heated than the structure without the heating mechanism.

The mask substrate is a approximately square glass substrate having a side of six inches long, and the heating plate is a circular plate for heating a semiconductor wafer having a diameter of 10 inches or 12 inches.

The present invention is a heat processing method for heating a mask substrate placed on a heating plate, comprising the steps of (a) detecting a temperature of the mask substrate and (b) moving a frame member disposed facing a side surface of the mask substrate placed on the heating plate, so that a distance between the mask substrate and the frame member varies in accordance with the detected temperature.

According to the present invention, by varying the distance between the frame member and each of the side surfaces of the mask substrate in accordance with the temperature change of the mask substrate, the temperature uniformity of the surface of the mask substrate can be improved. The detection of temperature of the mask substrate includes meaning of estimation of temperature of the mask substrate as well as the detection of the temperature of the mask substrate itself.

According to an aspect of the present invention, the step (b) has the steps of: determining whether the temperature of the mask substrate is in an increasing state or in a constant state based on the detected temperature, moving the frame member so that the distance becomes a first distance when the temperature is in the increasing state and moving the frame member so that the distance becomes a second distance smaller than the first distance when the temperature is in the constant state. Thus, while the temperature of the mask substrate is in the temperature increasing state, heat radiation is promoted. In contrast, when the temperature of the mask substrate is in the temperature constant state, heat radiation is suppressed. Thus, the temperature uniformity of the surface of the mask substrate can be improved.

These and other objects, features and advantages of the present invention will become more apparent in light of the following detailed description of a best mode embodiment thereof, as illustrated in the accompanying drawings.

DESCRIPTION OF PREFERRED EMBODIMENTS

Figure 1:
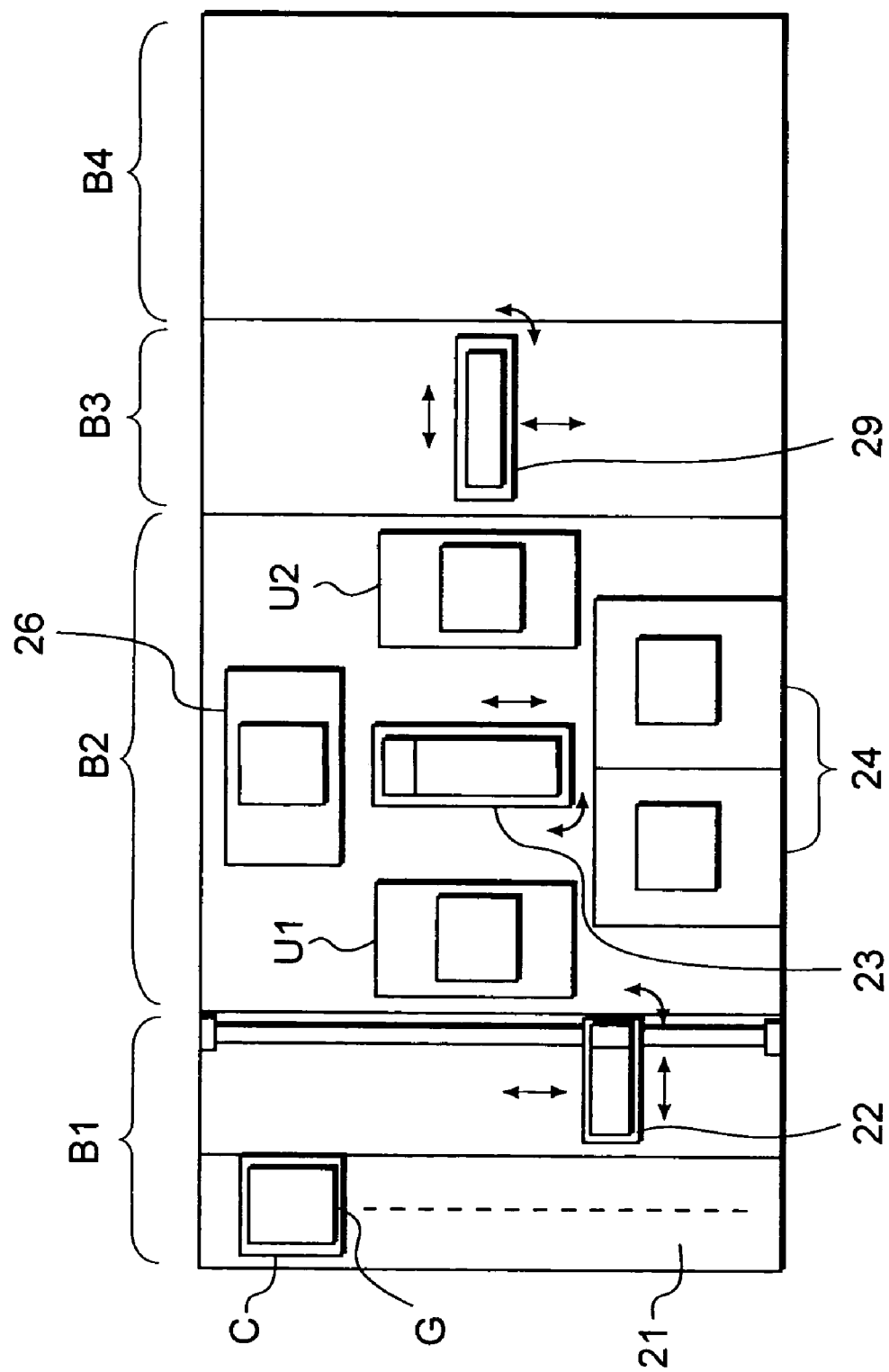
FIG. 1 is a plan view showing an overall structure of a coating film forming apparatus according to an embodiment of the present invention.
Figure 2:
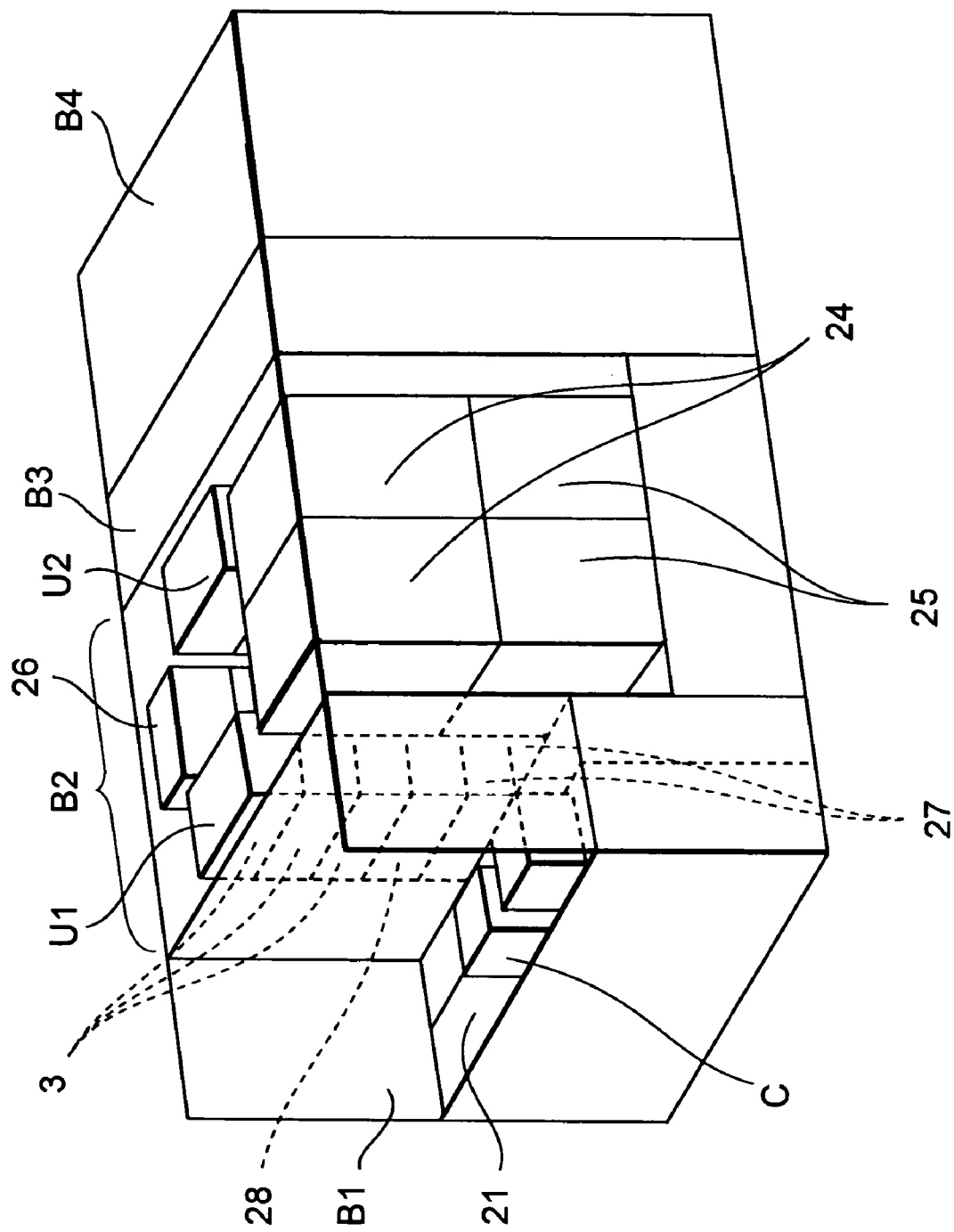
FIG. 2 is a schematic perspective view showing the overall structure of the coating film forming apparatus.

Next, a coating film forming apparatus in which a heat processing apparatus is disposed according to an embodiment of the present invention will be described. FIG. 1 is a plan view showing an overall structure of the coating film forming apparatus according to the embodiment of the present invention. FIG. 2 is a schematic perspective view showing the coating film forming apparatus shown in FIG. 1. In these drawings, B1 represents a carrier block that loads and unloads a carrier C that accommodates for example five substrates for example mask substrates G. The carrier block B1 has a carrier placing portion 21 and a transferring means 22. The carrier C is placed on the carrier placing portion 21.

Each mask substrate G is a glass substrate on which for example a semiconductor mask is formed. The mask substrate G is a six-inch size square glass substrate having four sides each of which is 152±0.5 mm long and having a thickness of 6.35 mm. The transferring means 22 is movable leftward, rightward, forward, and backward, liftable upward and downward, and rotatable around the vertical axis so as to take out a substrate G from the carrier C and transfer it to a processing portion B2 disposed on the far side of the carrier block B1.

A main transferring means 23 is disposed in the middle of the processing portion B2. The main transferring means 23 is surrounded by a coating unit 24, a developing unit 25, a cleaning unit 26, and shelf units U1 and U2. The coating unit 24 and the developing unit 25 are disposed for example on the right viewed from the carrier block B1. The cleaning unit 26 is disposed on the left viewed from the carrier block B1. The shelf units U1 and U2 are disposed on the near side and the far side viewed from the carrier block B1. The shelf unit U1 and the shelf unit U2 each have units of a heating and cooling system piled in multiple tires. The coating unit 24 is a unit that performs a process for coating a resist solution on a substrate. The developing unit 25 is a unit that performs a developing process for an exposed substrate continuously soaked in a developing solution for a predetermined time period. The cleaning unit 26 is a unit that washes a substrate before a resist solution is coated thereon.

Each of the shelf units U1 and U2 are composed of a plurality of units that are piled in succession. For example, as shown in FIG. 2, a heat processing unit 3, a cooling unit 27, a substrate G transferring unit 28, and so forth are piled in succession. The main transferring means 23 is liftable upward and downward, movable forward and backward, and rotatable around the vertical axis. The main transferring means 23 transfers a substrate G among the shelf units U1 and U2, the coating unit 24, the developing unit 25, and the cleaning unit 26. However, for simplicity, in FIG. 2, the transferring means 22 and the main transferring means 23 are omitted.

The processing portion B2 is connected to an aligner B4 through an interface portion B3. The interface portion B3 has a transferring means 29. The transferring means 29 is for example liftable upward and downward, movable leftward, rightward, forward, and backward, and rotatable around the vertical axis. The transferring means 29 transfers a substrate G between the processing portion B2 and the aligner B4.

Next, a flow of a substrate G in the coating film forming apparatus will be described. First of all, a carrier C is loaded from the outside to the carrier placing portion 21. The transferring means 22 takes out a substrate G from the carrier C. The substrate G is transferred from the transferring means 22 to the main transferring mechanism 23 through the transferring unit 28 of the shelf unit U1. The substrate G is successively transferred to predetermined units. For example, the cleaning unit 26 performs a predetermined cleaning process for the substrate G. The substrate G is heated and dried by one of the heat processing units. Thereafter, the temperature of the substrate G is adjusted to a predetermined value by one of cooling units 27. One of the coating units 24 performs a coating process for the substrate G with a resist solution of which a component of a coating film is dissolved with a solvent.

Thereafter, one of the heat processing units performs a pre-baking process for the substrate G so as to heat it at a predetermined temperature and evaporate and remove the solvent of the resist solution from the substrate G. Thereafter, one of the cooling units 27 adjusts the temperature of the substrate G to a predetermined value. Thereafter, the main transferring means 23 transfers the substrate G to the transferring means 29 of the interface portion B3 through the transferring unit 28 of the shelf unit U2. The transferring means 29 transfers the substrate G to the aligner B4. The aligner B4 performs a predetermined exposing process for the substrate G. Thereafter, the substrate G is transferred to the processing portion B2 through the interface portion B3. One of the heat processing units heats the substrate G at a predetermined temperature as a post-exposure process. Thereafter, one of the cooling units 27 cools the substrate G to a predetermined temperature so as to adjust the temperature of the substrate G. Thereafter, the developing unit 25 performs a predetermined developing process for the substrate G in such a manner that it is soaked in a developing solution. As a result, a predetermined circuit pattern has been formed on the substrate G. The substrate G is returned to the former carrier C through the main transferring means 23 and the transferring means 22 of the carrier block B1.

Figure 3:
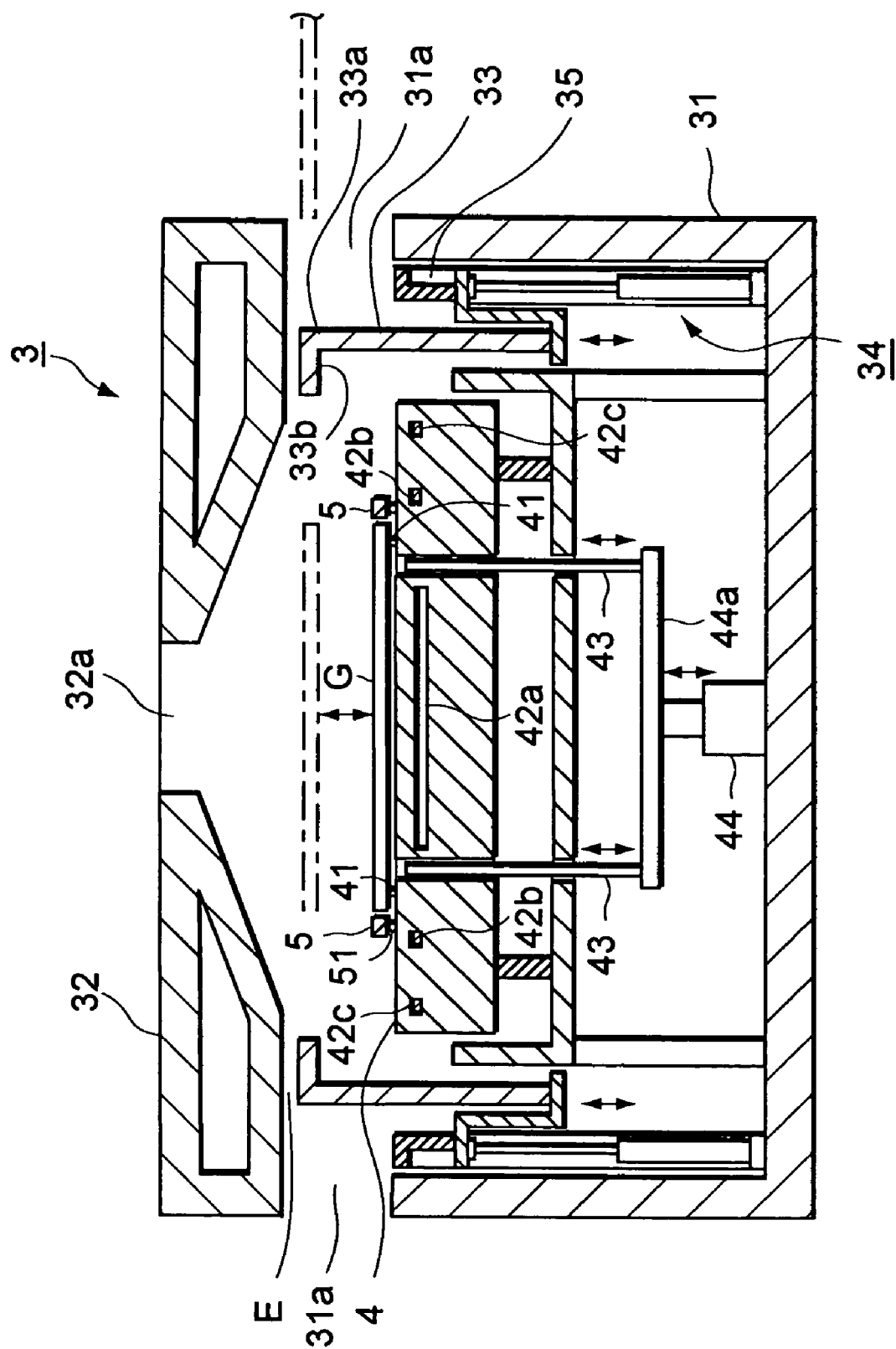
FIG. 3 is a sectional view showing an example of a heat processing unit disposed in the coating film forming apparatus.

Next, with reference to FIG. 3, the heat processing unit 3 that is a heat processing apparatus according to an embodiment of the present invention will be described. The heat processing unit 3 coats a resist solution on a substrate G and then performs a process for removing a solvent from the resist solution. In FIG. 3, reference numeral 31 represents a processing container. An opening portion 31a is formed for example on all the periphery of the side surfaces of the processing container so that the main transferring means 23 can access the inside of the processing container 31 through the opening portion 31a. An upper portion of the opening portion 31a is structured as an exhaust portion 32 that exhausts air from the processing container 31. At a approximately center region of a ceiling portion of the processing container 31 is an exhaust opening 32a. An exhausting means (not shown in FIG. 3) is connected to the exhaust opening 32a so that atmospheric gas of the processing space can be exhausted to the outside.

A heating plate 4 is disposed at a predetermined position in the processing container 31 in such a manner that a substrate G can be transferred to and from the main transferring means 23 through the opening portion 31a. The substrate G is placed on the heating plate 4 through the proximity pins 41 in such a manner that the substrate G slightly floats by for example around 0.5. In such a manner, the substrate G is heated by the heating plate 4.

Figure 4:
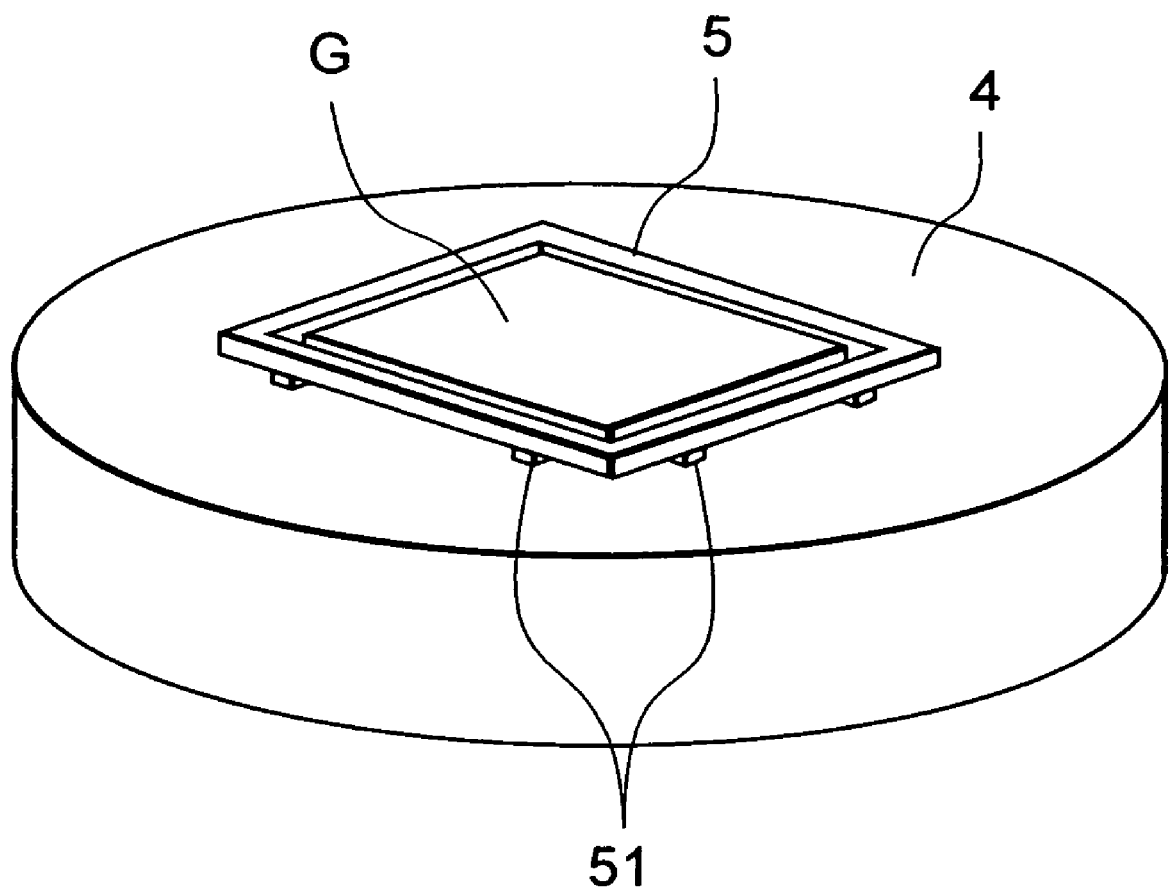
FIG. 4 is a schematic perspective view showing a heating plate, a frame member, and a substrate disposed on the heat processing unit.
Figure 5:
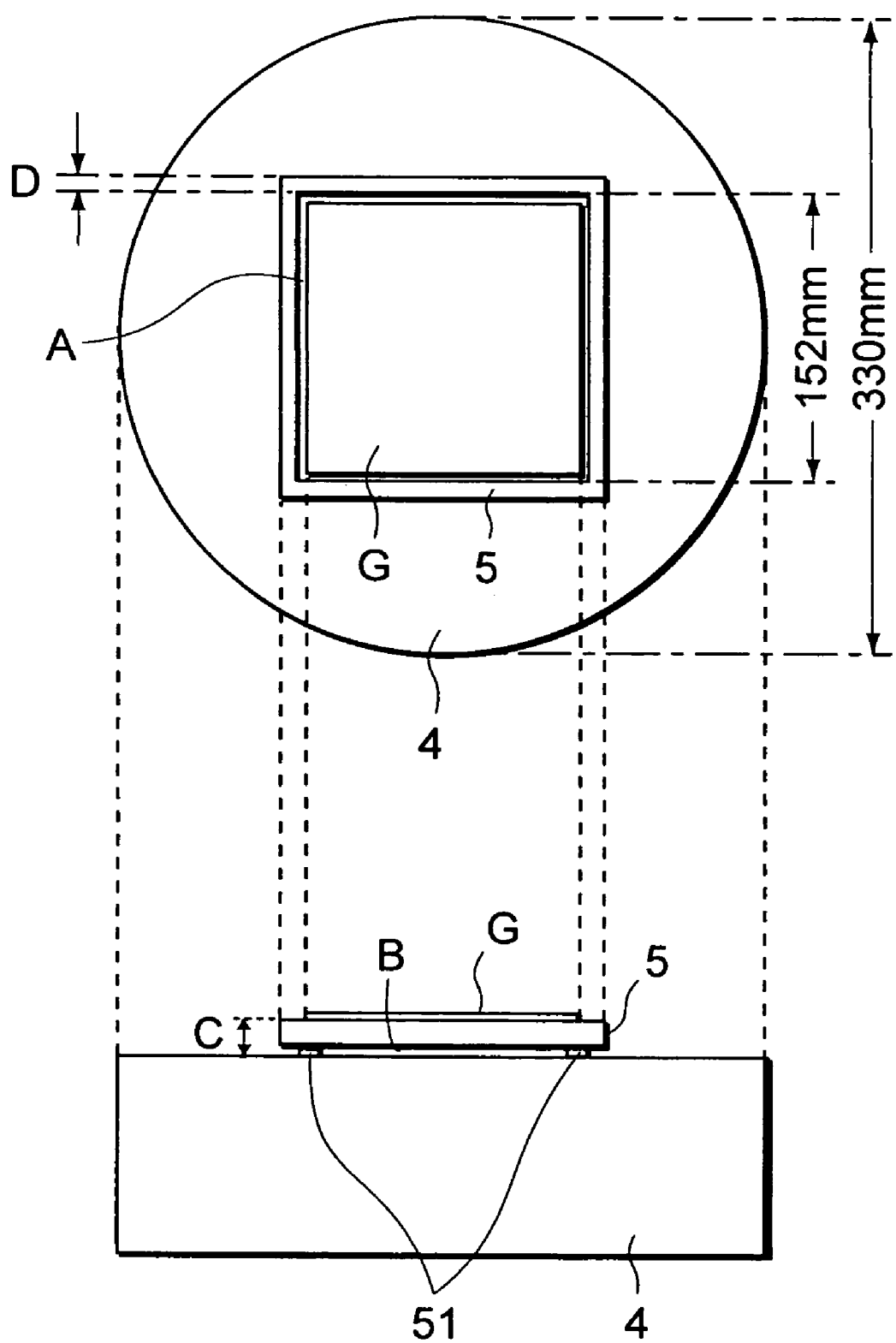
FIG. 5 is a plan view and side view showing the heating plate, the frame member, and the substrate.

For example, as shown in FIG. 4 and FIG. 5, the heating plate 4 is composed of a heating plate used for a heat process for a wafer having a diameter of 12 inches. In other words, the heating plate 4 is composed of a circular plate having a diameter of around 330 mm and a thickness of around 30 mm. The heating plate 4 is made of for example an aluminum alloy or stainless steel.

Figure 6:
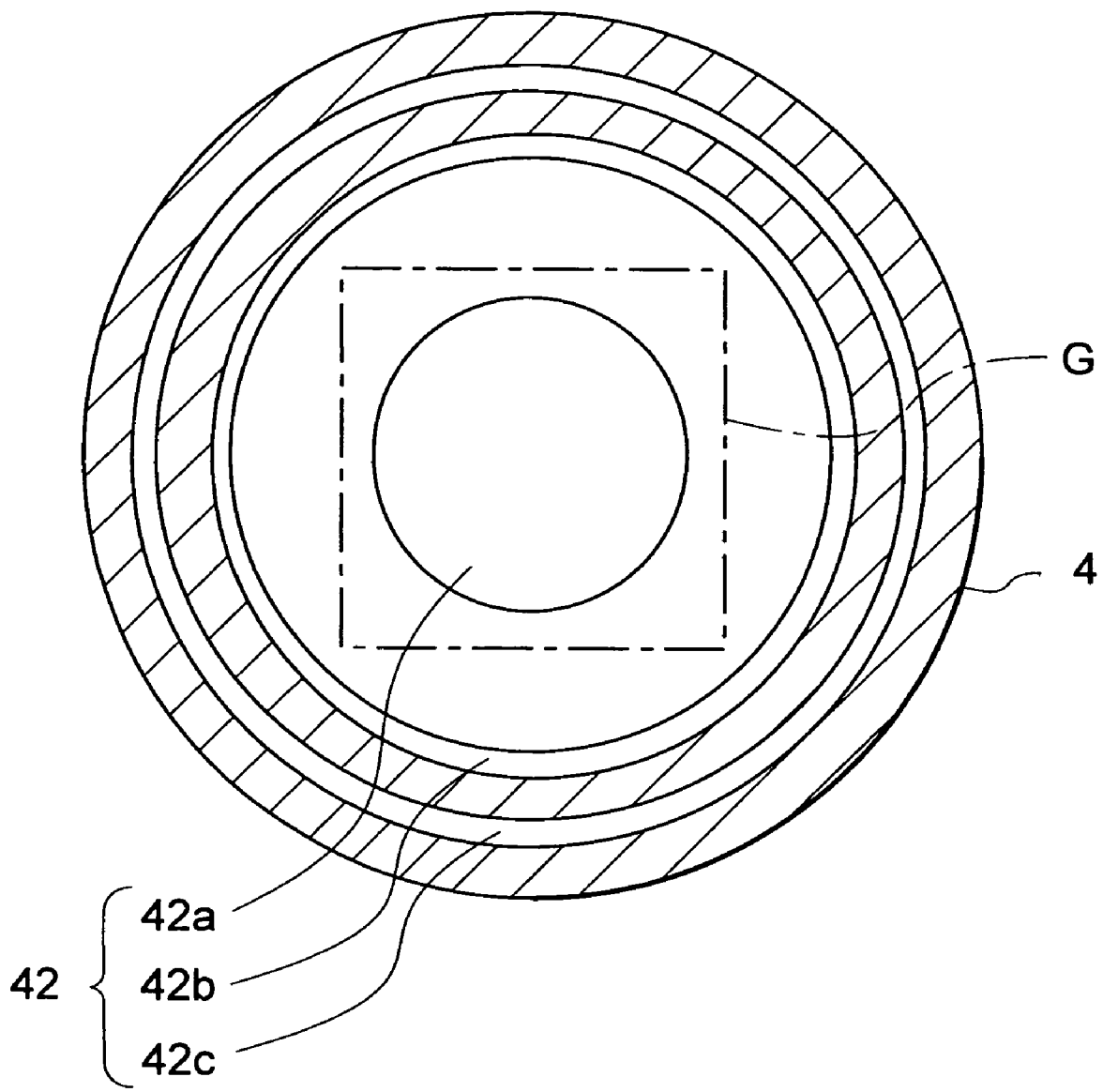
FIG. 6 is a plan view showing a heater disposed in the heating plate.

The heating plate 4 has an inner heater 42 that is a heating means. The heater 42 heats a substrate G at around 100° C. to 250° C. For example, as shown in FIG. 6, the heater 42 is composed of three heaters 42a, 42b, and 42c. The heater 42a is a circular plane heater 42a. The heaters 42b and 42c are disposed in a concentric circle shape. The heater 42a is surrounded by the heaters 42b and 42c. The heaters 42a, 42b, and 42c are disposed in such a manner that not only a region on which the substrate G is placed, but all the surfaces of the heating plate 4 can be fully heated. In this example, the ring-shaped heaters 42b and 42c are disposed outside the region on which the substrate G is placed. It should be noted that the number and shape of heaters 42 are not limited to those of the example. In addition, the plane heater 42a may be formed in a square shape. The ring-shaped heaters 42b and 42c may be formed in a square ring shape. The number of ring-shaped heaters may be increased or decreased. Alternatively, the substrate G may be heated by a plurality of ring-shaped heaters without use of a plane heater.

For example four supporting pins 43 are disposed in the heating plate 4 so as to transfer a substrate G to and from the main transferring means 23. The supporting pins 43 are connected to a lifting mechanism 44 through a holding plate 42a disposed below the heating plate 4. The lifting mechanism 44 causes tips of the supporting pins 43 to protrude and recess against the front surface of the heating plate 4 so that the heating plate 4 can be lifted upward and downward.

As shown in FIG. 4 and FIG. 5, a frame member 5 is disposed around a substrate G placed on the heating plate 4 in such a manner that a clearance A is formed between the frame member 5 and the substrate G. The frame member 5 is made of for example a square ring. Supporting portions 51 support for example a lower surface of the frame member 5. As a result, the frame member 5 is disposed above the front surface of the heating plate 4 with a small clearance B. The frame member 5 and the supporting portions 51 are made of a material having heat conductivity such as an aluminum alloy.

It is preferred that the clearance A formed between each of the side surfaces of the substrate G and the inner peripheral surface of the frame member 5 should be set in the range from for example around 1 mm to 10 mm and that the clearance B formed between the lower surface of the frame member 5 and the front surface of the heating plate 4 should be set in the range from for example around 0.1 mm to 0.5 mm. In addition, it is preferred that a height C of the frame member 5 should be set to the same as or slightly smaller than the height of the front surface of the substrate G. For example, the height C from the front surface of the heating plate 4 to the front surface of the frame member 5 is set in the range from for example around 5 mm to 6 mm. A width D of the frame member 5 is set to for example around 10 mm.

The opening portion 31a of the processing container 31 can be freely opened and closed with a cylindrical shutter 33. The shutter 33 is composed of a cylindrical member 33a and a horizontal piece 33b. The cylindrical member 33a is disposed outside the heating plate 4. The horizontal piece 33b is disposed at an upper end of the cylindrical member 33a and protrudes inward. The shutter 33 is liftable downward between an open position of the opening portion 31a where the horizontal piece 33b is placed in the vicinity of a lower position of the opening portion 31a and a close position of a almost close position of the opening portion 31a where the horizontal piece 33b is placed in the vicinity of an upper position of the opening portion 31a. When the shutter 33 is lifted upward, it is stopped at a position where a small clearance E is formed between the upper surface of the horizontal piece 33b and the lower surface of the exhaust portion 32. In FIG. 3, reference numeral 35 represents a stopper that stops the shutter 33 at a predetermined height.

When a substrate G is loaded into the heat processing unit 3 or unloaded therefrom, the shutter 33 is lowered and the main transferring means 23 is entered into the processing container 31 through the opening portion 31a. With cooperating operations of the main transferring means 23 and the supporting pins 43, the substrate G is transferred to and from the heating plate 4. After the substrate G is placed at a predetermined position of the heating plate 4, the main transferring means 23 is caused to retreat from the processing container 31. Thereafter, the shutter 33 is lifted upward. As a result, the heat processing unit 3 is shut out with a clearance E formed between the exhaust portion 32 and the shutter 33. In other words, while air is being exhausted in a so-called semi-closed state, the substrate G is heated at for example around 120° C. by the heating plate 4.

According to the present embodiment, since the frame member 5 is disposed around the substrate G, the frame member 5 suppresses heat radiation from the side surfaces of the substrate. As a result, the temperature uniformity of the surface of the substrate can be improved. Since the frame member 5 and the supporting portions 51 have thermal conductivity, heat of the heating plate 4 is transferred to the frame member 5 through the supporting portions 51. Alternatively, heat of the heating plate 4 is transferred to the frame member 5 by radiant heat of the heating plate 4. As a result, the frame member 5 itself is heated. Since the inner peripheral surface of the frame member 5 is disposed only in the vicinities of the side surfaces of the substrate G, the vicinities of the side surfaces of the substrate G are heated by the frame member 5. Thus, even if the thickness of the substrate G is large, heat radiation from the side surfaces of the substrate can be suppressed.

Figure 7:
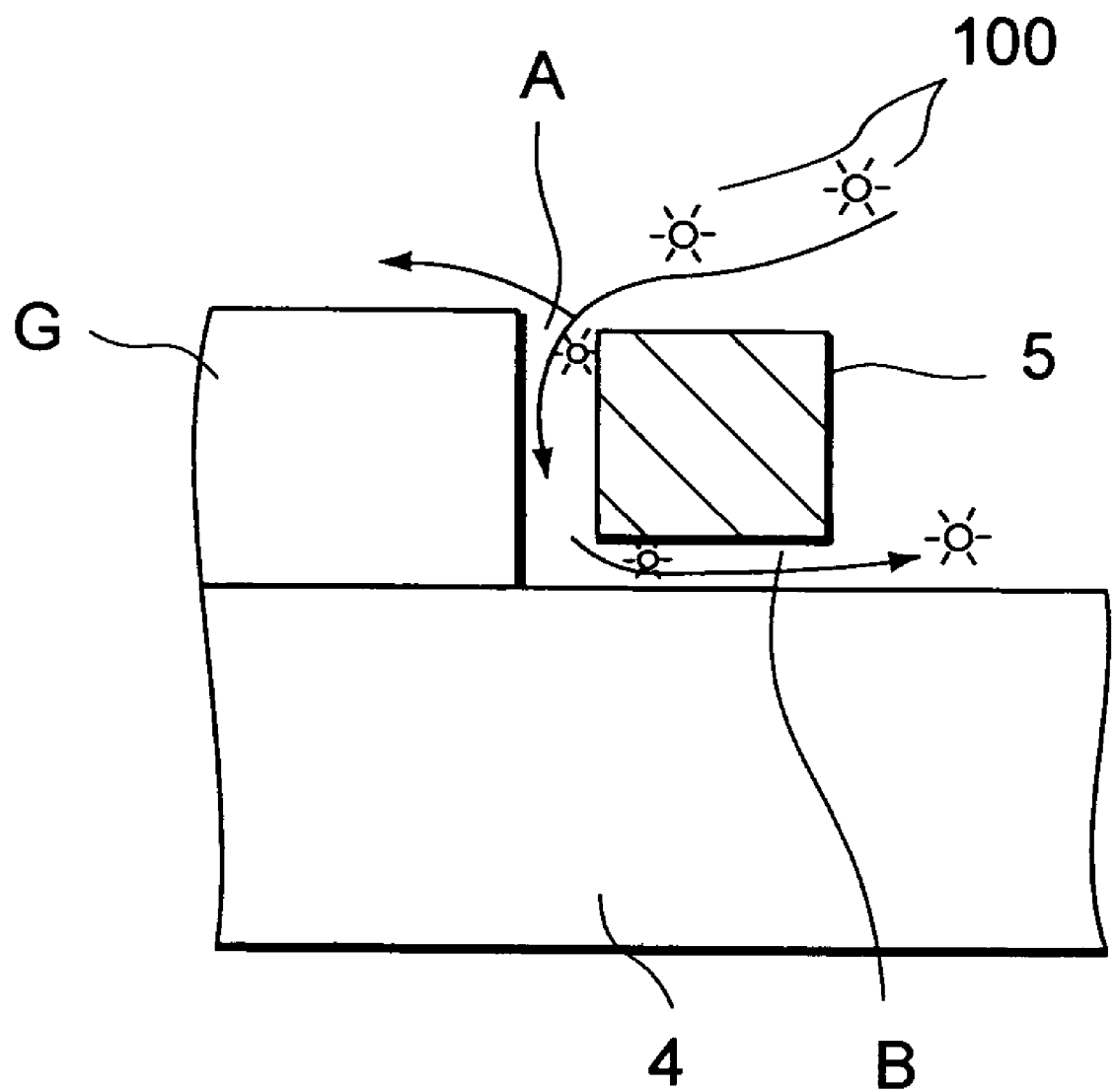
FIG. 7 is a side sectional view describing an operation of the frame member.

In the processing container 31, an air current that flows from the clearance E formed between the shutter 33 and the exhaust portion 32 to the exhaust opening 32a takes place. Thus, particles may scatter along the air current, which flows from the outside of the substrate G to the inside of the heat processing unit 3. At that point, when the height of the frame member 5 is lower than the height of the front surface of the substrate G, since particles 100 collide with each of the side surfaces of the substrate G and enter the clearance A formed between each of the side surfaces and the frame member 5, adhesion of the particles 100 to the front surface of the substrate G can be suppressed as shown in FIG. 7. In addition, since the clearance B is formed between the frame member 5 and the heating plate 4, the particles 100 that enter the clearance A formed between the substrate G and the frame member 5 are exhausted with an exhaust current that takes place in the processing container 31 through the clearance B. Thus, the particles 100 can be prevented from accumulating at corner portions between the frame member 5 and the heating plate 4. As a result, contamination of the substrate G with the particles can be suppressed.

In this example, since the heating plate 4 is a conventional circular plate that heats a wafer having a diameter of 12 inches, it is not necessary to newly prepare a heating plate that heats a square substrate having four sides each of which is six inches long. Thus, the heat processing apparatus is advantageous from a view point of cost. While one side of the six-inch size square substrate is approximately 152 mm, the diameter of the heating plate 4 is as large as around 330 mm. Thus, the temperature uniformity of the surface of the substrate can further be improved.

It is thought that the reason results from the following. When the substrate G is placed on the heating plate 4, the shutter 33 is closed, and then the process is started, since the inside of the shutter 33 is cooled, an air current that flows from the outside of the substrate G to the inside thereof is cooled by the shutter 33. In this case, if the heating plate is slightly larger than the substrate G, the cold air directly reaches the substrate G. As a result, the temperature of the outer peripheral region of the substrate G lowers. In addition, since the heating plate 4 radiates heat outward from the peripheral region thereof, heat radiation from the side surfaces of the substrate G is promoted. This causes the temperature of the outer peripheral region of the substrate G to lower. However, if the temperature of the heater in the peripheral region of the heating plate 4 is tried to be raised against the heat radiation, since the heating plate 4 is close to the region on which the substrate G is placed, the temperature of the peripheral region of the substrate G excessively rises. As a result, the temperature uniformity of the surface of the substrate deteriorates.

In contrast, when the size of the heating plate 4 is sufficiently larger than the size of a substrate G, a heater is also disposed outside the region on which the substrate G is placed, and all the heating plate 4 is heated, the air current cooled by the shutter 33 is sufficiently heated by the heating plate 4 until the air current reaches the substrate G. Thus, since a cold air current does not reach the substrate G, the temperature of the outer peripheral region of the substrate G can be prevented from decreasing. In addition, even if heat radiation takes place from the peripheral region of the heating plate 4, the peripheral region of the heating plate 4 is heated so as to compensate the heat radiation. However, since the peripheral region of the heating plate 4 is far apart from the region on which the substrate G is placed, the heat radiation of the heating plate 4 does not affect the temperature of the substrate G. As a result, the temperature of the outer peripheral portion of the substrate G does not easily lower. Consequently, the temperature uniformity of the surface of the substrate G can be improved.

Figure 8A:
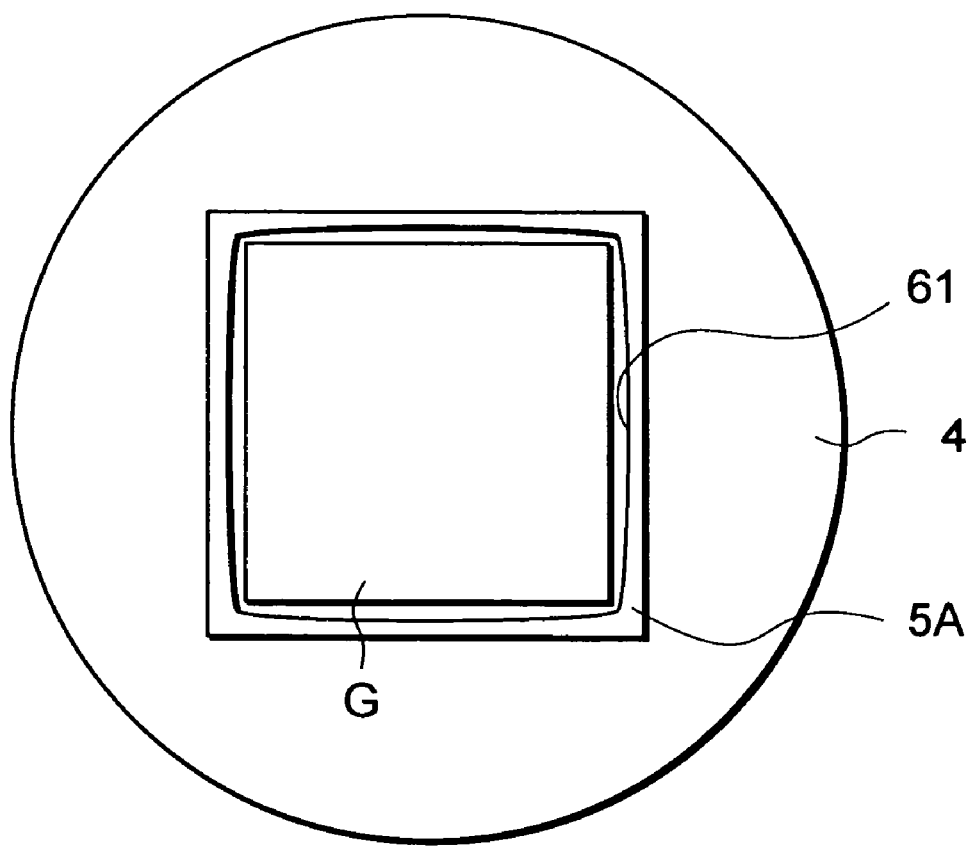
FIG. 8A and FIG. 8B are a plan view and a schematic perspective view, respectively, showing another example of the frame member.
Figure 8B:
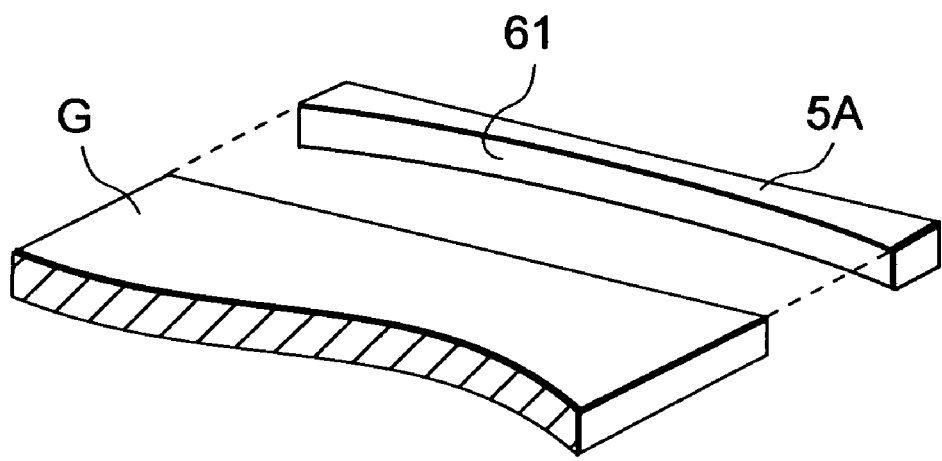

Next, another example of the frame member 5 will be described. In this example, the frame member 5 is structured in such a manner that an inner surface thereof (a surface opposite to the side surfaces of the substrate G) is curved. FIG. 8A and FIG. 8B are a plan view and a perspective view, respectively, showing a frame member 5A having an inner surface 61 (a surface opposite to each of side surfaces of a substrate G) curved in a concave surface shape. In this example, the frame member 5A is structured in such a manner that a vicinity region of each corner portion of the substrate is close to the inner surface 61 of the frame member 5A and that a vicinity region of a center portion of each side surface of the substrate G is apart from the inner surface 61 of the frame member 5A. Thus, the vicinity of each corner portion of the substrate G is selectively heated by the frame member 5A.

The frame member 5A is effective when the processing temperature of the substrate G is as large as for example 200° C. or higher and heat radiation from the heating plate 4 is large. When the processing temperature is high, heat radiation from the four corners of the substrate G becomes large. Thus, when the corners of the substrate G are close to the frame member 5A and the center regions of the side surface of the substrate G are apart from the frame member 5A, the corner portions of the substrate G are selectively heated by the frame member 5A. As a result, heat radiation from these regions can be suppressed. As a result, the temperature uniformity of the surface of the substrate can be improved.

Figure 9A:
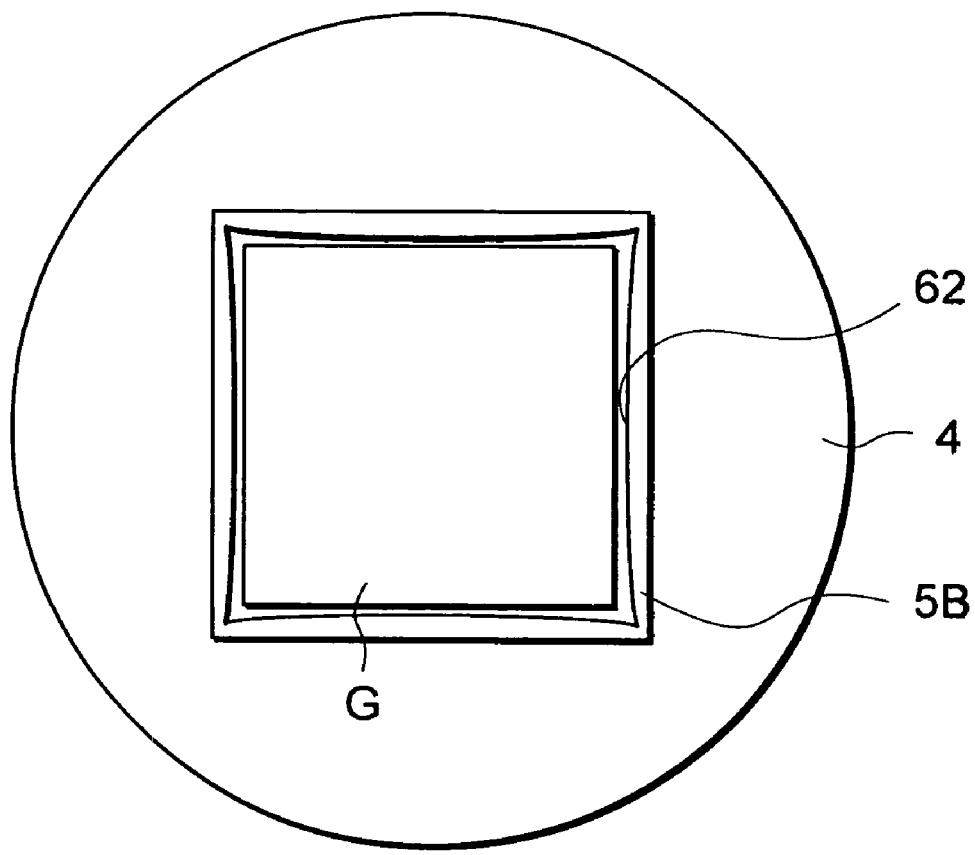
FIG. 9A and FIG. 9B are a plan view and a schematic perspective view, respectively, showing another example of the frame member.
Figure 9B:
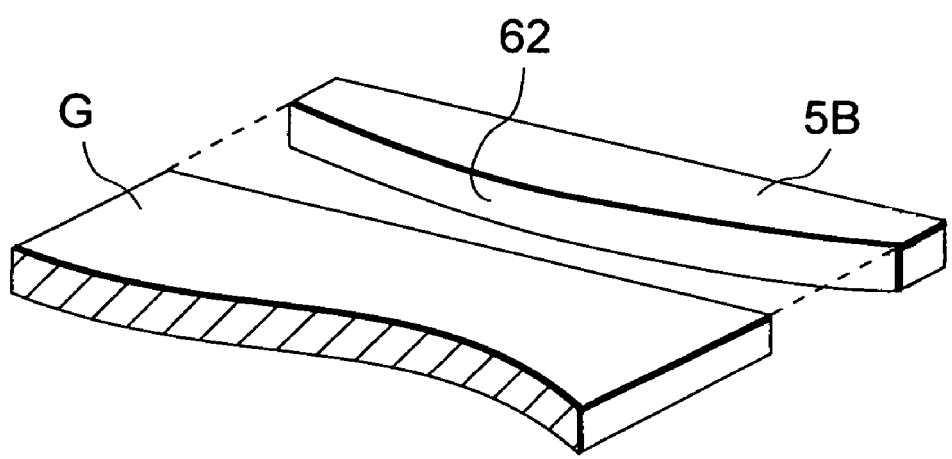

FIGS. 9A and 9B are a plan view and a perspective view, respectively, showing a frame member 5B having an inner surface 62 curved in a convex surface shape. In the example, the inner surface of the frame member 5B is formed in such a manner that a vicinity region of a center portion of each side of the substrate G is close to the inner surface 62 of the frame member 5B and that a vicinity region of each corner portion of the substrate G is apart from the inner surface 62 of the frame member 5B. Thus, the vicinity regions of the center portions of the sides of the substrate G can be selectively heated by the frame member 5B.

The frame member 5B is effective when the processing temperature of the substrate G is as low as 100° C. and the substrate G is heated by thermal conduction from the heating plate 4 through the proximity pins 41. When the substrate G is heated by thermal conduction through the proximity pins 41, the temperatures of contact regions of the proximity pins 41 and the substrate G become higher than the temperatures of the other regions. The proximity pins 41 are often disposed in the vicinity regions of the corner portions of the substrate G. Thus, the temperatures of the vicinity regions of the corner portions are higher than the temperatures of the other regions. Thus, when the vicinity regions of the corner portions of the substrate G are apart from the frame member 5B and the vicinity regions of the center portions of the side surfaces of the substrate G are close to the frame member 5B, heat radiation from the four corners of the substrate G becomes large and the center portions of the side surfaces of the substrate G are selectively heated by the frame member 5B. As a result, the temperature uniformity of the surface of the substrate can be improved.

Alternatively, the inner surface of the frame member 5 (5A, 5B) may be mirror surface, the inner surface of the frame member 5 (5A, 5B) being opposite to the substrate G. In this case, heat radiated from each of the side surfaces of the substrate G is reflected by the inner surface of the frame member 5 and so forth. As a result, the temperature of each of the side surfaces of the substrate G can be prevented from decreasing. In addition, the inner surface of the frame member 5 may be a rough surface. The rough surface is a surface whose surface roughness is around Ra=100 μm. In this case, heat radiated from the inner surface of the frame member 5 and so forth becomes large. The radiated heat heats each of the side surfaces of the substrate G. As a result, the temperature of each of the side surfaces of the substrate G can be prevented from decreasing.

In the foregoing, when the inner surface of the frame member 5A, 5B is curved or formed of a mirror surface or a rough surface, the frame member 5A, 5B may be disposed on the heating plate 4 without a clearance.

Next, another example of the frame member will be described. In this example, a frame member 5C is movable so that the distance between the inner surface of the frame member 5C and each of the side surfaces of the substrate G placed on the heating plate 4 is varied. In reality, the frame member 5C is composed of a four rod-shaped plates 71 (71a, 71b, 71c, and 71d) that are opposite to the side surfaces of the substrate G. Each plate 71 is approximately horizontally movable by for example a driving mechanism 73 that is disposed for example below the heating plate 4 through for example supporting members 72 that pierce the heating plate 4 in such a manner that the inner surfaces of the plates 71 approach the side surfaces of the substrate G placed on the heating plate and move away therefrom.

The driving mechanism 73 is composed of for example a ball screw, an air cylinder, and so forth. The driving mechanism 73 is controlled by for example a controlling portion 200 in such a manner that the distance between the side surface of the substrate G and the inner surface of the frame member 5C is varied in the range from for example around 1 mm to 10 mm in accordance with the processing temperature and processing time for the substrate G.

Figure 11A:
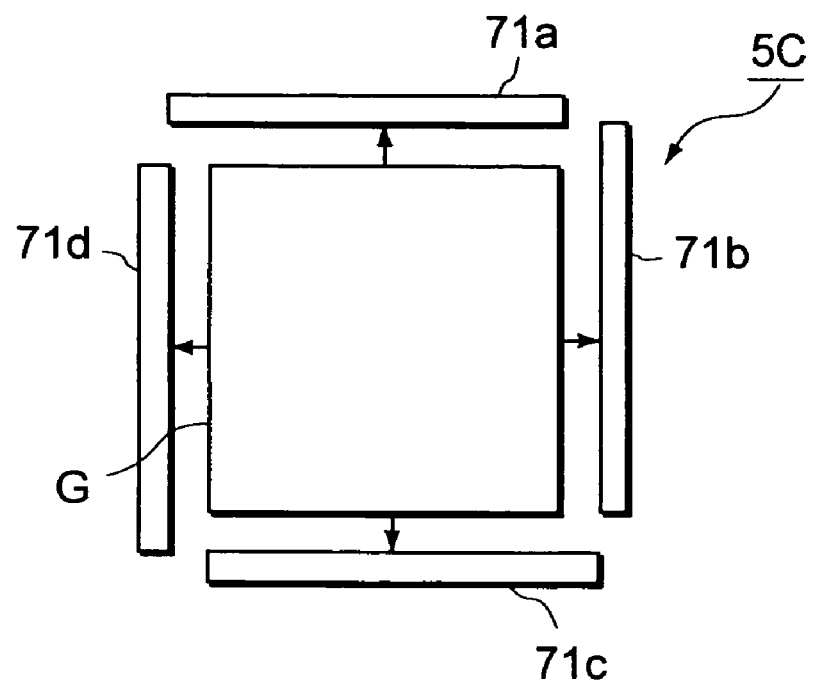
FIG. 11A and FIG. 11B are plan views describing an operation of the frame member shown in FIG. 10.
Figure 11B:
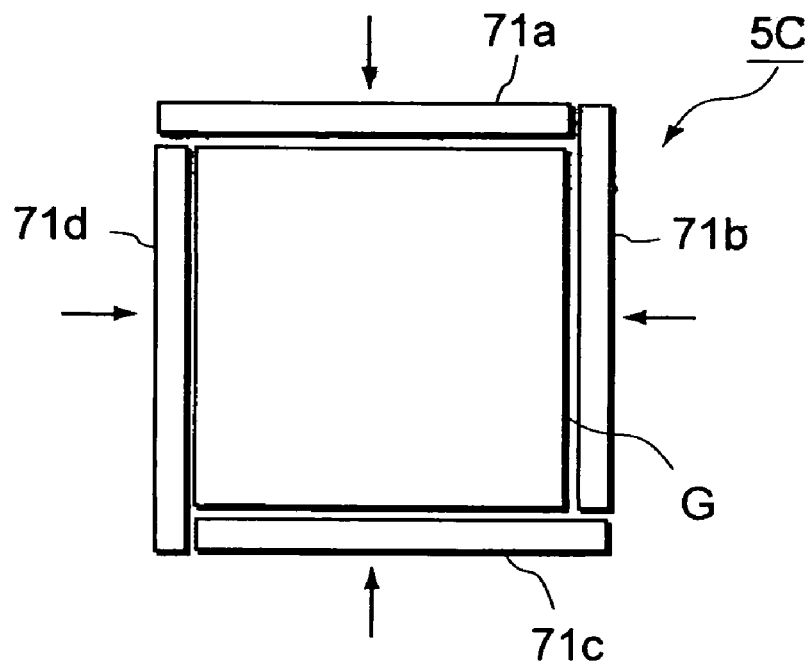

In such a structure, when the temperature of the substrate G is raised, the temperature of a peripheral region thereof tends to rise. Thus, as shown in FIG. 11A, the plate 71 is placed at a position apart from the side surface of the substrate G so as to prevent the temperature of the peripheral region of the substrate G from increasing. When the temperature of the substrate G is in a temperature constant state after the temperature of the substrate G has been raised, the temperature of the peripheral region thereof tends to lower. Thus, as shown in FIG. 11B, the plate 71 is approached to the side surface of the substrate G so as to prevent the temperature of the peripheral region thereof from decreasing. As a result, the temperature uniformity of the surface of the substrate can further be improved.

Figure 10A:
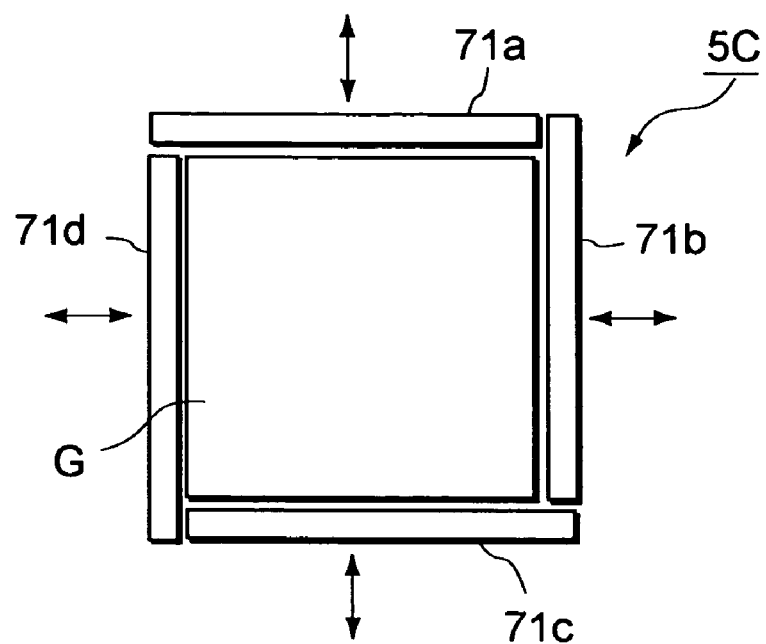
FIG. 10A and FIG. 10B are a plan view and a side sectional view, respectively, showing another example of the frame member.
Figure 10B:
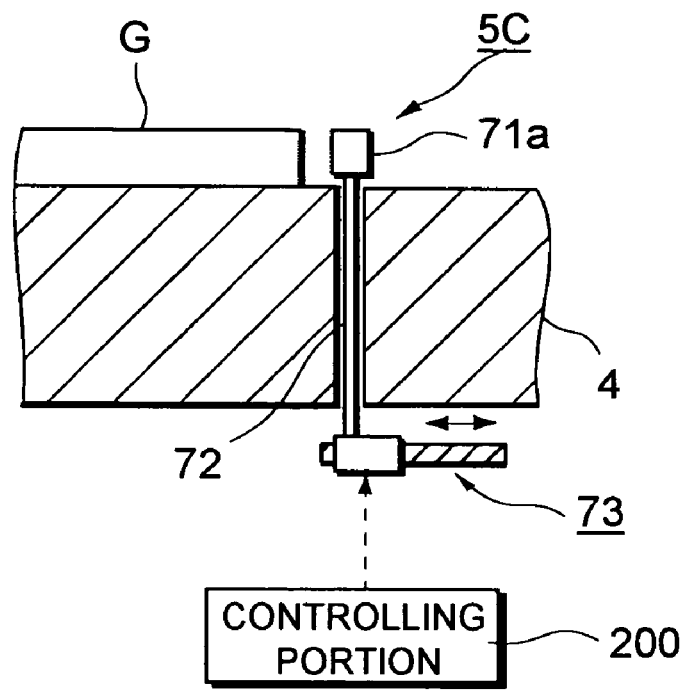
Figure 12A:
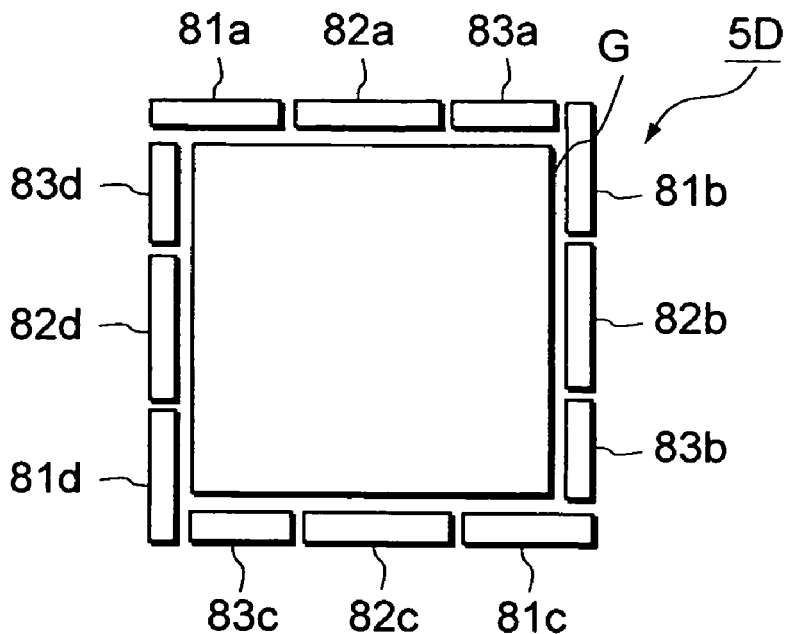
FIG. 12A and FIG. 12B are plan views showing another example of the frame member.
Figure 12B:
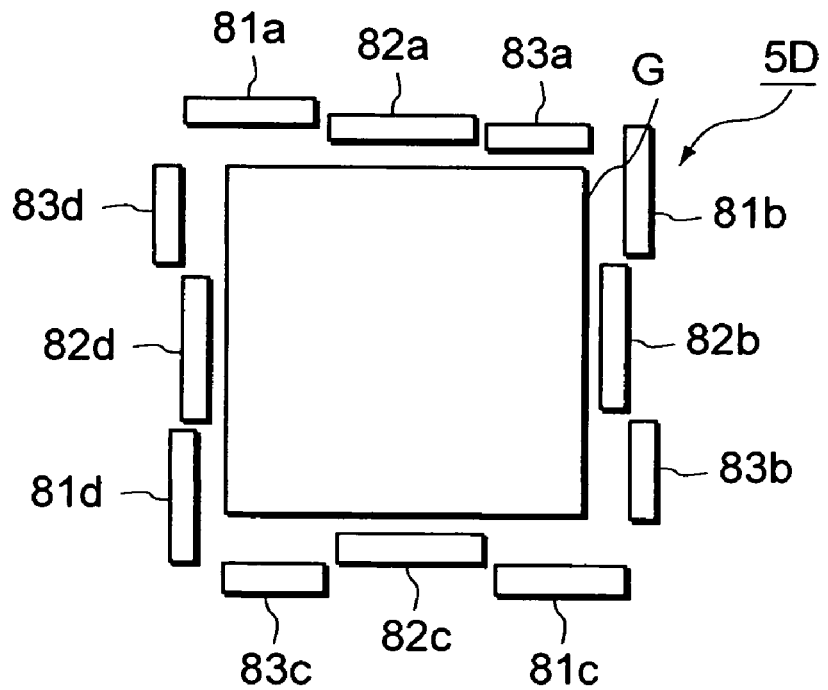

Alternatively, as shown in FIG. 12A, a frame member 5D may be used. The frame member 5D is composed of plates 81 (81a, 81b, 81c, and 81d) to 83 (83a, 83b, 83c, and 83d) of which the plates 71a to 71d shown in FIG. 10A and FIG. 10B are divided into three portions each in their longitudinal directions. The divided plates 81 (81a to 81d) to 83 (83a to 83d) are driven by a horizontal driving mechanism so that the distance between each of the divided plates 81 (81a to 81d) to 83 (83a to 83d) and each of the side surfaces of the substrate G can be varied. As shown in FIG. 12B, by placing the divided plates 81 to 83 in such a manner that the distance between each of the divided plates 82 and the vicinity region of each side of the substrate G and the distance between each of the divided plates 81 and 83 and the vicinity region of each corner portion of the substrate G become proper values, amounts of heat radiated from the center portion of each side and each corner portion of the substrate G are controlled. Thus, since the temperature of each portion of the substrate G can be controlled. As a result, the temperature uniformity of the surface of the substrate can further be improved.

Figure 13:
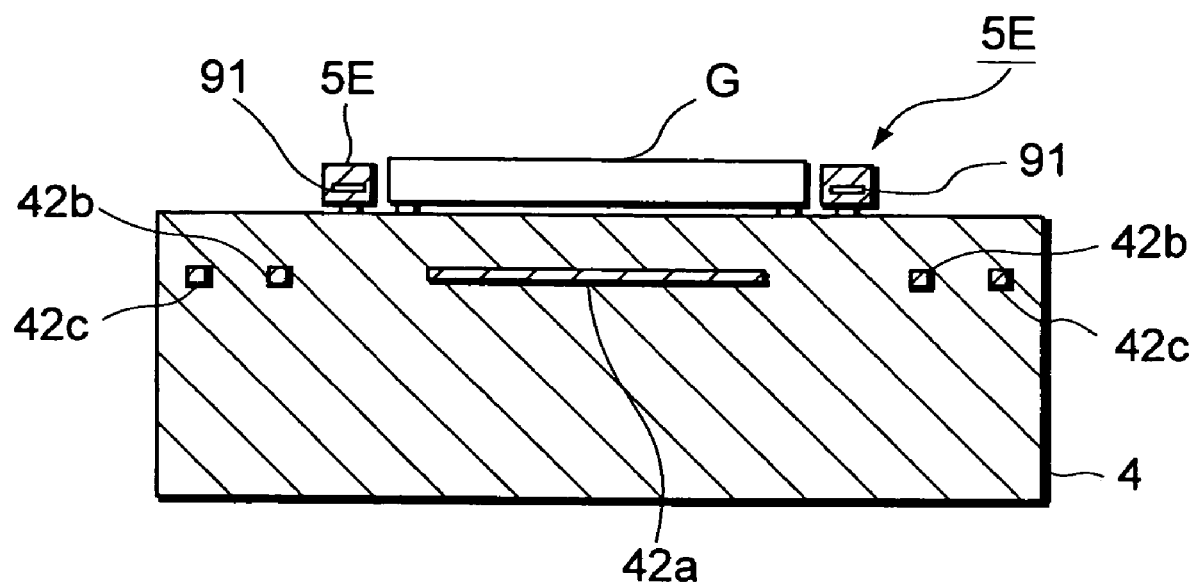
FIG. 13 is a side sectional view showing another example of the frame member.

In addition, according to the present embodiment, as shown in FIG. 13, a heater 91 as a heating mechanism composed of a resistor heating member may be disposed in a frame member 5E. The temperature of the heater 91 may be varied by a controlling portion (not shown in FIG. 13) in accordance with the processing temperature and processing time for the substrate G. The amount of heat radiated from the substrate G is varied in accordance with the temperature of the frame member 5E. Thus, when the temperature of the frame member 5E is optimally adjusted at timings of which the temperature of the substrate G is increasing, decreasing, and constant, the amount of heat radiated from the substrate G is optimally controlled. As a result, the temperature uniformity of the surface of the substrate can be improved.

In the structures shown in FIG. 10 to FIG. 13, the frame members 5C, 5D, and 5E may be disposed on the heating plate 4 without a clearance.

Next, examples that the inventors of the present invention conducted to confirm the effects of the present invention will be described.

FIRST EXAMPLE

A square-type substrate having four sides each of which is six inches long and having temperature sensors was placed on a circular heating plate that has a diameter of 330 mm and that is used to heat a semiconductor wafer having a diameter of 12 inches. A frame member made of an aluminum alloy was disposed around the substrate. The substrate was heated at 120° C. by the heating plate and the substrate was kept in a temperature constant state. In that state, the temperatures of the surface of the substrate were detected. At that point, the distance between each of the side surfaces of the substrate and the inner surface of the frame member was 2 mm. The height of the frame member from the front surface of the heating plate was 6 mm. The width of the frame member was 10 mm. The distance between the lower surface of the frame member and the front surface of the heating plate was 0.1 mm. In this example, a heating plate having a diameter of 330 mm was exemplified. However, it should be noted that as long as the heating plate can heat a semiconductor wafer having a diameter of at least 10 inches, the diameter of the heating plate is not limited.

Figure 14A:
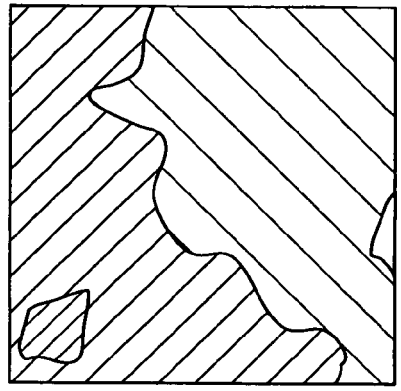
FIG. 14A, FIG. 14B, and FIG. 14C are plan views showing temperature distributions of substrates as results of a first example, a first comparison, and a second comparison conducted for confirming effects of the present invention.

In the square substrate having temperature sensors, temperature sensors were disposed at 31 positions of the surface of the substrate. In accordance with measured values of the temperature sensors, a temperature distribution on the surface of the substrate is created. The measured result is shown in FIG. 14A. The range width of the temperatures of the surface of the substrate was 1.07° C. It is clear that the smaller the range width is, the higher the temperature uniformity of the surface of the substrate becomes.

(First Comparison)

Figure 14B:
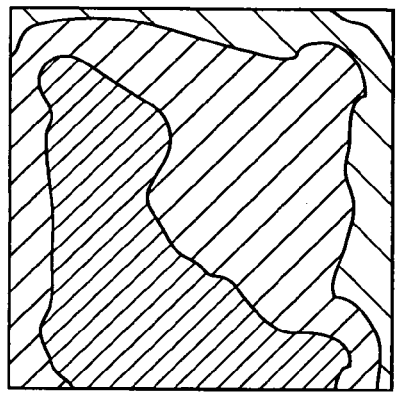

An experiment was conducted in the same condition as the first example except that a frame member was not disposed around the substrate. A temperature distribution on the surface of the substrate was created. The result is shown in FIG. 14B. The range width of the temperatures on the surface of the substrate was 1.51° C.

(Second Comparison)

Figure 14C:
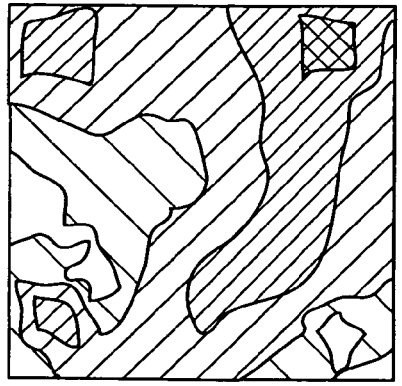

The heating plate was changed to a circular heating plate that has a diameter of 270 mm and that is used to heat a semiconductor wafer having a diameter of eight inches was used. In addition, the frame member was not disposed around the substrate. Except for those, an experiment was conducted in the same condition as the first example and a temperature distribution on the surface of the substrate was created. The result is shown in FIG. 14C. The range width of the temperatures on the surface of the substrate was 1.93° C.

These results show that the temperature uniformity of the surface of the substrate of each of the first example and the first comparison is higher than that of the second comparison. Thus, it is understood that it is effective to heat a square substrate that has four sides each of which is six inches long and that uses the circular heating plate used to heat a wafer having a diameter of 12 inches.

In addition, when the first example is compared with the first comparison, the graph of the first comparison shows a tendency of which the temperature in the vicinity of the center portion of the substrate is high and the temperature on the outer periphery of the substrate is low (namely, the temperature of the substrate lowers as the distance from the center portion toward the outer peripheral portion becomes large). However, the experimental result of the first example shows that the difference between the temperature at the center portion of the substrate and the temperature at the outer peripheral portion is small and that when the frame member is disposed around the substrate, the temperature uniformity of the surface of the substrate can be improved. In addition, in the structure of the first example, particles were not found between the frame member and the heating plate.

SECOND EXAMPLE

A square substrate having four sides each of which is six inches long and having temperature sensors was placed on a circular heating plate that has a diameter of 330 mm and that is used to heat a semiconductor wafer having a diameter of 12 inches. A frame member made of an aluminum alloy was disposed around a substrate. The substrate was heated at 150° C. and kept in a temperature constant state by the heating plate. In that state, the temperature on the surface of the substrate were measured. At that point, the substrate was supported by proximity pins disposed on the front surface of the heating plate in such a manner that the substrate floated on the front surface of the heating plate by 80 µm. The distance between each of the side surfaces of the substrate and the inner surface of the frame member was 2 mm. The height of the frame member from the front surface of the heating plate was 6 mm. The width of the frame member was 10 mm. The distance between the lower surface of the frame member and the front surface of the heating plate was 0.1 mm.

Figure 15A:
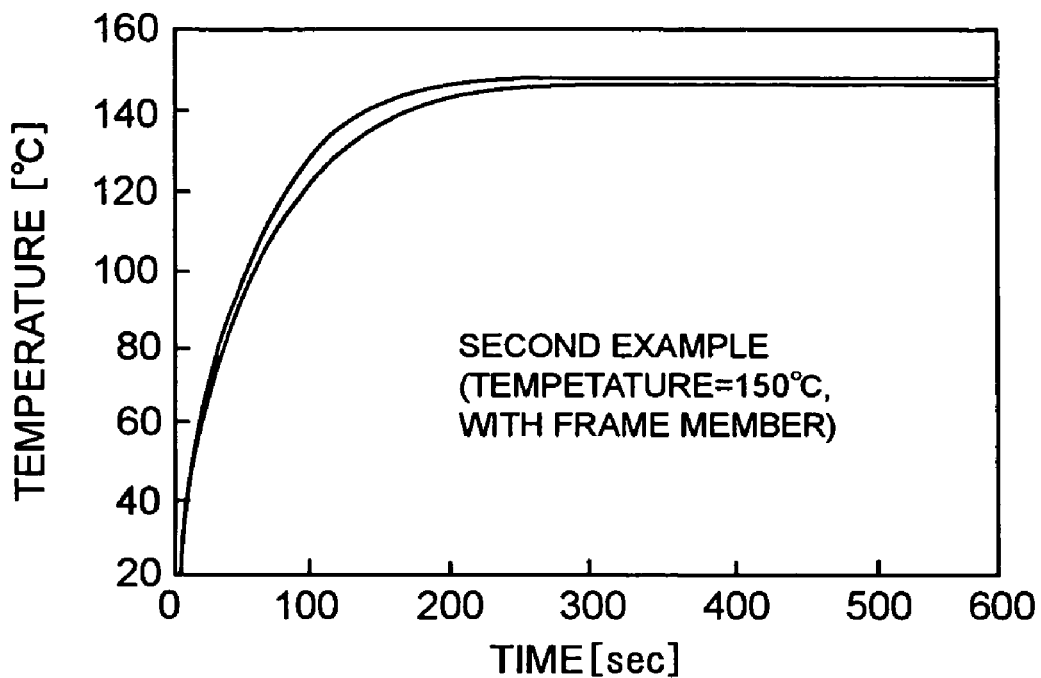
FIG. 15A and FIG. 15B are characteristic diagrams showing results of a second example and a third comparison conducted for confirming effects of the present invention.

FIG. 15A shows a chronological change of measured values of the temperatures of the 31 temperature sensors of the substrate. In the ranges of two temperature curves, temperature curves of the measured values of all the temperature sensors are contained. The results of an experiment conducted two times show that the range widths of the temperatures on the surface of the substrate were 0.95° C. and 1.04° C. in a time period from 400 seconds to 600 seconds after the substrate was heated and the temperature of the substrate became stable.

(Third Comparison)

Figure 15B:
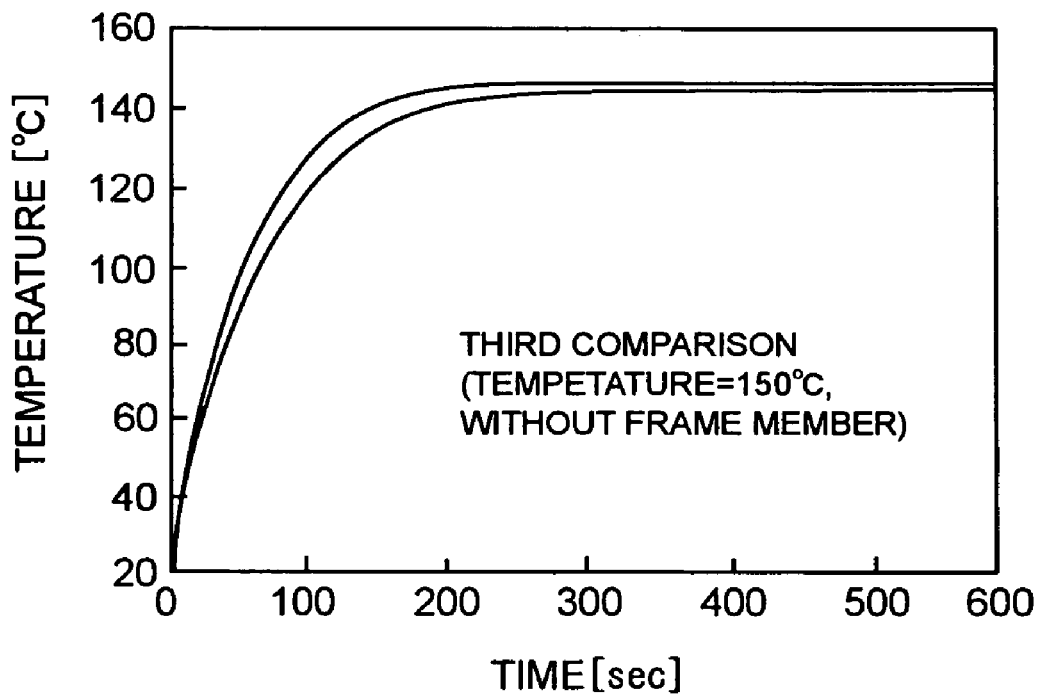

Except that the frame member was not disposed around the substrate, an experiment was conducted in the same condition as that of the second example. FIG. 15B shows a chronological change of measured values of the temperatures of the temperature sensors. The range width of the temperatures on the surface of the substrate in a time period from 400 seconds to 600 seconds after the substrate was heated and the substrate temperature became stable was 1.27° C.

THIRD EXAMPLE

Figure 16A:
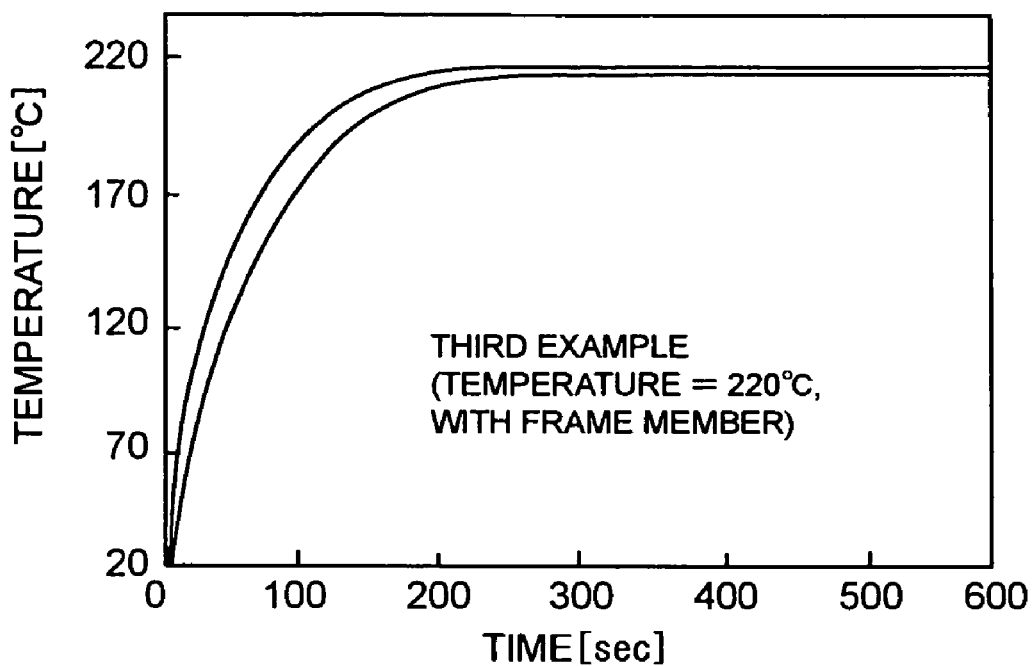
FIG. 16A and FIG. 16B are characteristic diagrams showing results of a third example and a fourth comparison conducted for confirming effects of the present invention.

Except that the substrate was heated at 220° C., an experiment was conducted in the same condition as the second example. FIG. 16A shows a chronological change of measured values of the temperatures of temperature sensors. The range width of the temperatures on the surface of the substrate in a time period from 400 second to 600 seconds after the substrate was heated and the substrate temperature became stable was 1.50° C.

(Fourth Comparison)

Figure 16B:
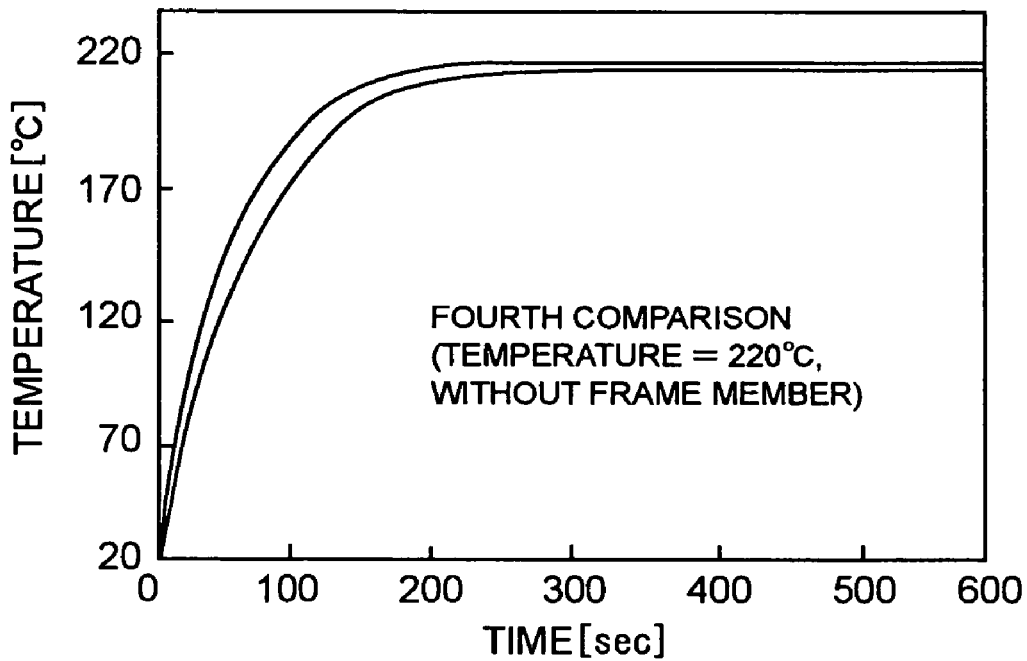

Except that the frame member was not disposed around the substrate, an experiment was conducted in the same condition as that of the third example. FIG. 16B shows a chronological change of measured values of the temperatures of the temperature sensors. The range width of the temperatures on the surface of the substrate in a time period from 400 seconds to 600 seconds after the substrate was heated and the substrate temperature became constant was 2.30° C.

When the substrate was heated at 150° C. and 220° C., the range width of the temperatures on the surface of the substrate in the structure of which the frame member was disposed is lower than that in the structure of which the frame member was not disposed. Thus, it is clear that with the frame member, high temperature uniformity of the surface of the substrate can be secured. In the structures of the second and third examples, particles were not found between the frame member and the heating plate.

Next, with reference to FIG. 17, a heat processing apparatus according to another embodiment of the present invention will be described with respect to the difference with the foregoing embodiment.

Figure 17:
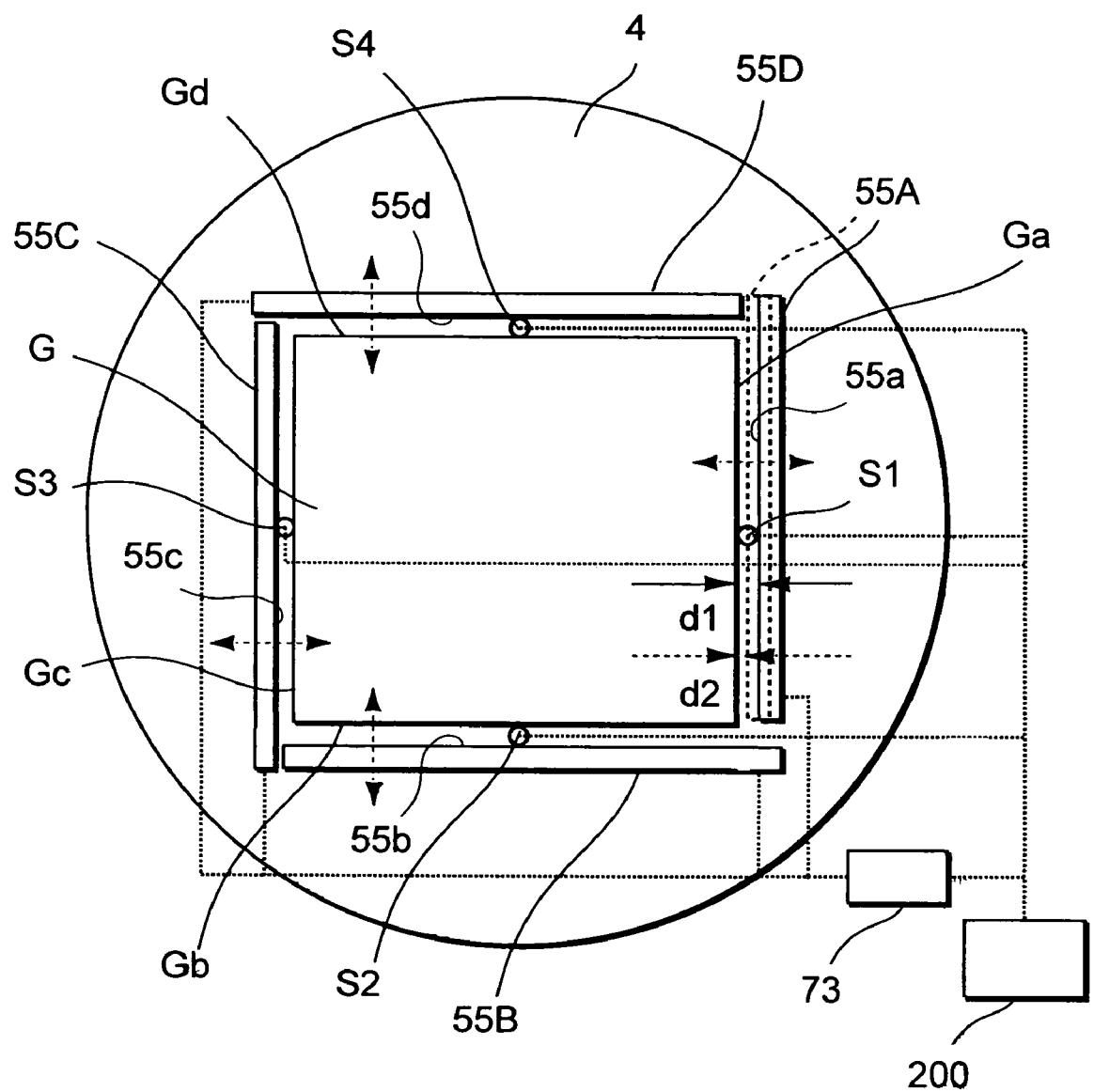
FIG. 17 is a plan view showing a position controlling mechanism for a frame member according to another embodiment of the present invention.

As shown in FIG. 17, according to the present embodiment, plates 55A, 55B, 55C, and 55D are detachably disposed around the substrate G placed on the heating plate 4. For example, the plates 55A, 55B, 55C, and 55D are detachably disposed on the supporting members 72 shown in FIG. 10B. As an attaching and detaching method, the plates 55A, 55B, 55C, and 55D may be secured to the supporting members 72 with screws. Alternatively, the plates 55A, 55B, 55C, and 55D each may have a concave portion (not shown in FIG. 17). The concave portions of the plates 55A, 55B, 55C, and 55D may be engaged with the respective supporting members 72 so as to secure the plates 55A to 55D to the supporting members 72.

Temperature sensors S1, S2, S3, and S4 as means for detecting the temperatures in the vicinities of the side surfaces of the substrate G are disposed between the substrate G placed on the heating plate 4 and the plates 55A, 55B, 55C, and 55D, respectively. The temperature sensors S1 to S4 are disposed in the vicinities of the approximately center positions of the four sides of the substrate G. It should be noted that the number of temperature sensors is not limited to four. Instead, the number of temperature sensors may be eight rather than four. In addition, as the positions of the temperature sensors S1 to S4, they may be in contact with the side surfaces Ga, Gb, Gc, and Gd of the substrate G. With the temperature sensors S1 to S4 in contact with the side surfaces Ga, Gb, Gc, and Gd, temperature information of the substrate G can be more accurately obtained than that structure without them. The detected values of the temperature sensors S1 to S4 are transferred to a controlling portion 200. The plates 55A, 55B, 55C, and 55D are connected to the controlling portion 200 through the foregoing driving mechanism 73. The plates 55A, 55B, 55C, and 55D are independently movable in approximately horizontal direction to the side surfaces Ga, Gb, Gc, and Gd, respectively, of the substrate G placed on the heating plate 4. The heating plate 4 is designed to heat a semiconductor wafer having a diameter of at least 10 inches.

Next, a controlling method of the positions of the plates 55A, 55B, 55C, and 55D in accordance with the temperatures of the substrate G detected by the temperature sensors S1 to S4, respectively, will be described. Before the substrate G is heated, the distances between the inner surfaces 55a to 55d of the plates 55A to 55D and the side surfaces Ga to Gd of the substrate G are set to distance d (around 5 mm).

First of all, the heating plate 4 starts heating the substrate G. The temperatures in the vicinities of the side surfaces Ga, Gb, Gc, and Gd of the substrate G are detected by the temperature sensors S1 to S4 at every predetermined time interval. The predetermined time interval can be set in the range from several seconds to several minutes.

The controlling portion 200 receives the detected values of the temperature sensors S1 to S4 at every predetermined time interval. The controlling portion 200 calculates temperature change amounts of the temperature sensors S1 to S4 at every predetermined time interval. As a result, the controlling portion 200 determines whether the temperatures of the side surfaces Ga, Gb, Gc, and Gd of the substrate G are in a temperature constant state, a temperature decreasing state, or a temperature increasing state.

When the temperature of the side surface Ga of the substrate G is in the temperature constant state or the temperature decreasing state, the controlling portion 200 rotates the ball screw of the driving mechanism 73 so as to move the plate 55A in an arrow direction shown in FIG. 17. As a result, the inner surface 55a of the plate 55A approaches the side surface Ga of the substrate G. Thus, the distance d1 becomes distance d2 that is smaller than the distance d1.

In contrast, when the temperature of the side surface Ga of the substrate G is in temperature increasing state, the controlling portion 200 moves the plate 55A in the arrow direction shown in FIG. 17 so that the inner surface 55a of the plate 55A goes away from the side surface Ga of the substrate G. Thus, the distance d2 becomes the distance d1.

It is not always necessary to dispose the temperature sensors S1 to S4. Alternatively, the controlling portion 200 may control the driving mechanism 73 in accordance with the processing temperature at which the substrate G is processed by the heating plate 4, namely, the temperature of the heating plate 4 itself. In this case, since the controlling portion 200 controls the driving mechanism 73 in accordance with only the temperature of the heating plate 4, the controlling portion 200 controls the plates 55A, 55B, 55C, and 55D with the same control amount rather than independent control amounts.

According to the present embodiment, it can be determined whether the temperatures of the side surfaces Ga, Gb, Gc, and Gd of the substrate G are in the temperature constant state, the temperature decreasing state, or the temperature increasing state. When the temperature of the side surface Ga of the substrate G is in the temperature constant state or the temperature decreasing state, the plate 55A can be moved so that the inner surface 55a of the plate 55A approaches the side surface Ga of the substrate G. In contrast, when the temperature of the side surface Ga of the substrate G is in the temperature increasing state, the plate 55A can be moved so that the inner surface 55a of the plate 55A goes away from the side surface Ga of the substrate G (this applies to the other side surfaces Gb, Gc, and Gd of the substrate G).

Thus, by increasing heat supplied from the plate 55A to the substrate G, the temperature of the side surface Ga can be concentratively raised. In contrast, by decreasing heat supplied from the plate 55A to the substrate G, the temperature of the side surface Gb can be lowered. As a result, the temperature uniformity of the surface of the substrate G can be improved.

According to the present embodiment, the plates 55A, 55B, 55C, and 55D are detachably disposed around the substrate G placed on the heating plate 4. In such a structure, even if particles accumulate between the plates 55A, 55B, 55C, and 55D and the side surfaces Ga, Gb, Gc, and Gd of the substrate G, by detaching the plates 55A, 55B, 55C, and 55D from the heating plate 4, the particles can be removed therefrom. Thus, the heat processing unit can be easily maintained. In addition, the substrate G can be prevented from being contaminated with particles.

According to the present embodiment, the temperatures in the vicinities of the side surfaces Ga, Gb, Gc, and Gd of the substrate G are detected by the temperature sensors S1 to S4 at intervals of every several seconds to every several minutes. When the interval of the detection time is shortened, the temperature change of the substrate G can be quickly detected. Thus, the temperature uniformity of the surface of the substrate G can be improved.

In the foregoing description of the foregoing two embodiments, by suppressing heat radiation from the side surfaces of the substrate, the temperature the surface of the substrate can be secured. Since the amount of heat radiated from each of side surfaces of a substrate having a large thickness is large, those embodiments are especially effective for a heat process for a substrate having a thickness of for example 3 mm or more.

Figure 18A:
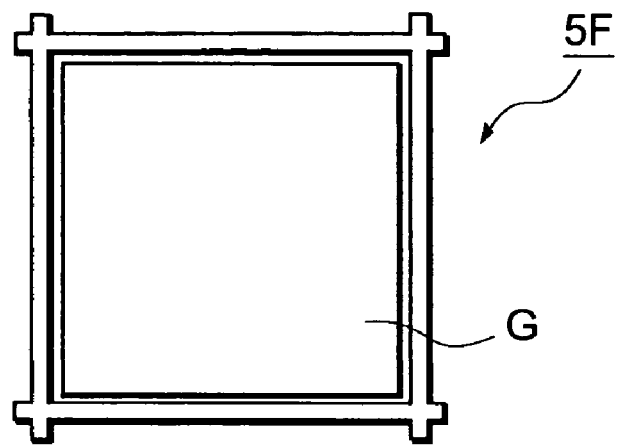
FIG. 18A, FIG. 18B, and FIG. 18C are a plan view, a side sectional view, and a side sectional view showing another example of the frame member and the heating plate according to the present invention.
Figure 18B:
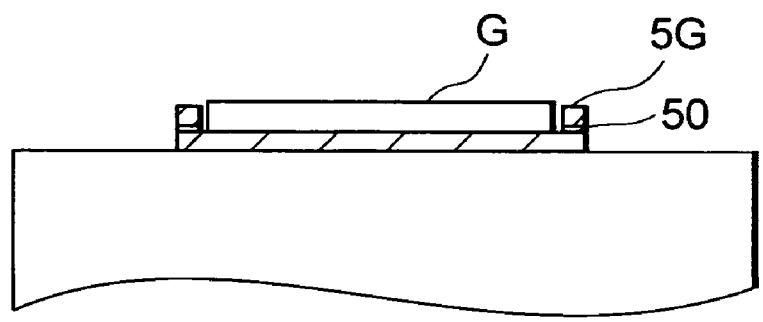
Figure 18C:
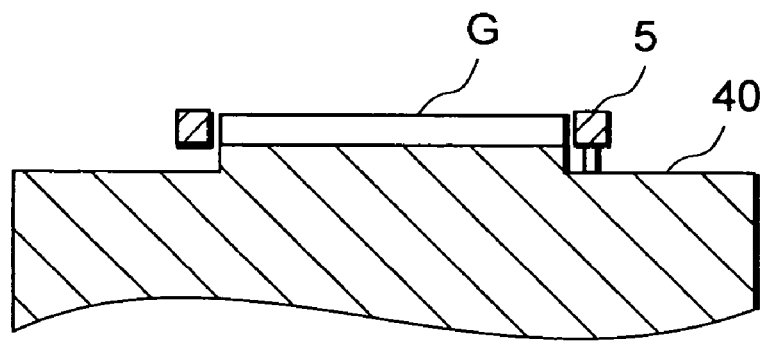
Figure 19:
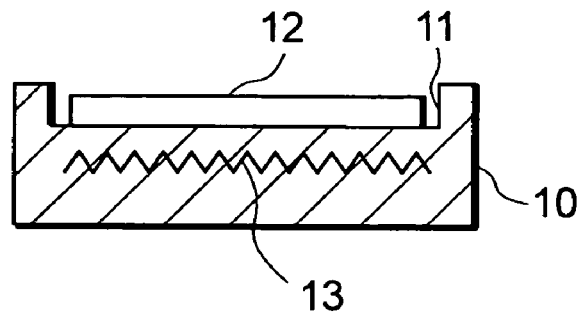
FIG. 19 is a side sectional view showing an example of a heating plate of a conventional heat processing unit.
Figure 20:
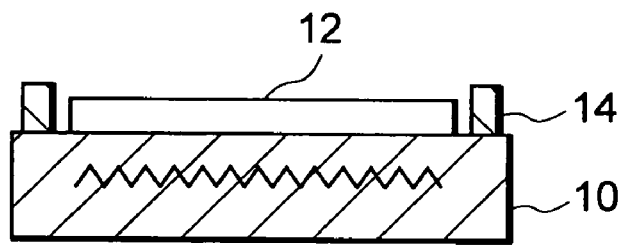
FIG. 20 is a side sectional view showing another example of a heating plate of a conventional heat processing unit.
Figure 21:
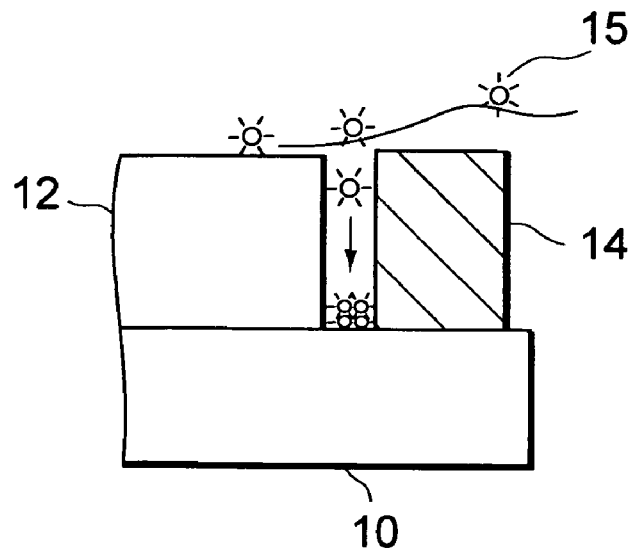
FIG. 21 is a side sectional view showing an operation of a heating plate of a conventional heat processing unit.

In addition, according to the foregoing embodiment, it is not always necessary to cause the frame member 5 (5A to 5E) to surround all the periphery of a substrate, but part thereof. Alternatively, the frame member 5 (5A to 5E) may have an area that does not surround the substrate. In addition, it is not always necessary to form the frame member 5 (5A to 5E) in a ring shape. In other words, the frame member 5 (5A to 5E) may be separated members. As shown in FIG. 18A, a frame member 5F may be formed in a sharp "#" shape. Alternatively, as shown in FIG. 18B, a frame member 5G may be formed in a tray shape of which a substrate G is held in the frame member 5G. A part of the bottom of the frame member 5G may be cut so as to form a clearance 50. In addition, as shown in FIG. 18C, a heating plate 40 may have a protruded surface or an inclined surface on which a substrate is placed.

According to the present invention, as long as the heat processing unit performs the predetermined heat process, the heat processing unit is not limited to the foregoing structures. In other words, the heat processing unit may have a chamber type structure as well as the structure using the shutter that opens and closes the wafer loading opening. In addition, the present invention can be applied to not only a heat process for a substrate on which a resist solution has been coated, but heat processes such as a heat and dry process performed after a substrate has been washed, a post-exposure bake process performed after a wafer has been exposed, and a post-bake process performed after a substrate has been developed. The foregoing embodiment describes an apparatus that processes a square type substrate for use with a semiconductor mask. In addition, the present invention can be applied to an apparatus that processes a substrate for a flat panel display (FPD) for example a circular substrate or the like that has a large thickness and that is processed for a special purpose.

In FIG. 17, an example of which the plates 55A, 55B, 55C, and 55D are detachably disposed on the heating plate 4 was described. However, not only the embodiment shown in FIG. 17, but at least one example of the embodiment shown in FIG. 3 to FIG. 13 may have a structure of which the frame member is detachably disposed on the heating plate 4.

The disclosure of Japanese Patent Application No. 2003-032603 filed Feb. 10, 2003 including Specification, Drawings and Claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An apparatus, for heat-processing a mask substrate, comprising:
    a heating plate for heating the mask substrate, the heating plate including a front surface facing the mask substrate, the mask substrate disposed on a first side of the heating plate, the mask substrate including a side surface;
    heating means for heating the heating plate; and
    a frame member disposed on the first side of the heating plate so as to overlap the heating plate as viewed from the first side, the frame member including an inner peripheral surface directly opposite the side surface of the mask substrate such that a first clearance is disposed between the inner peripheral surface and the side surface, the frame member being detachably supported by the heating plate so that the frame member is disposed around the mask substrate, and the frame member and mask substrate are disposed within a same plane that is parallel to the front surface of the heating plate.

2. The heat processing apparatus as set forth in claim 1, wherein the inner peripheral surface is curved in a concave shape.

3. The heat processing apparatus as set forth in claim 1, wherein the inner peripheral surface is curved in a convex shape.

4. The heat processing apparatus as set forth in claim 2, wherein the inner peripheral surface is a mirror surface.

5. The heat processing apparatus as set forth in claim 2, wherein the inner peripheral surface is a rough surface.

6. An apparatus, for heat-processing a mask substrate, comprising:
    a heating plate for heating the mask substrate, the heating plate including a front surface facing the mask substrate, the mask substrate including a side surface;
    heating means for heating the heating plate;
    a frame member, having an inner peripheral surface directly opposite the side surface of the mask substrate such that a first clearance is disposed between the inner peripheral surface of the frame member and the side surface of the mask substrate, the frame member being detachably disposed above the heating plate so that the frame member is disposed around the mask substrate, and the frame member and mask substrate are disposed within a same plane that is parallel to the front surface of the heating plate; and
    a driving mechanism configured to move the frame member so that a distance between the frame member and the side surface of the mask substrate placed on the heating plate varies in a direction perpendicular to the side surface.

7. The heat processing apparatus as set forth in claim 6, further comprising:
    means for detecting a temperature of the mask substrate; and
    a controlling portion for controlling the driving mechanism in accordance with the detected temperature.

8. The heat processing apparatus as set forth in claim 7, wherein the controlling portion determines whether the temperature of the mask substrate is in an increasing state or in a constant state in accordance with the detected temperature, controls the driving mechanism so that the distance between the frame member and the side surface of the mask substrate placed on the heating plate becomes a first distance when the temperature of the mask substrate is in the increasing state and a second distance smaller than the first distance when the temperature of the mask substrate is in the constant state.

9. The heat processing apparatus as set forth in claim 1, wherein the frame member is divided along the inner peripheral surface in a peripheral direction of the mask substrate placed on the heating plate.

10. The heat processing apparatus as set forth in claim 1,
    wherein the mask substrate is an approximately square glass substrate having a side surface six inches long, and
    wherein the heating plate is a circular plate for heating a semiconductor wafer having a diameter of 10 inches.

11. The heat processing apparatus as set forth in claim 1, further comprising a supporting portion for movably supporting the frame member so that a second clearance is formed between the frame member and the heating plate.

12. The heat processing apparatus as set forth in claim 11, wherein the frame member and the supporting portion comprise material having a heat conductivity.

13. The heat processing apparatus as set forth in claim 1, further comprising a heater, different than the heating means, disposed in the frame member.

14. The heat processing apparatus as set forth in claim 1, further comprising a clearance between the frame member and the front surface of the heating plate.

* * * * *